US012148611B2

(12) United States Patent
Noda et al.

(10) Patent No.: US 12,148,611 B2
(45) Date of Patent: Nov. 19, 2024

(54) SUBSTRATE PROCESSING METHOD, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Takaaki Noda, Toyoma (JP); Tomoki Imamura, Toyoma (JP); Kazuyuki Okuda, Toyoma (JP); Masato Terasaki, Toyoma (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 47 days.

(21) Appl. No.: 17/477,227

(22) Filed: Sep. 16, 2021

(65) Prior Publication Data

US 2022/0102136 A1 Mar. 31, 2022

(30) Foreign Application Priority Data

Sep. 30, 2020 (JP) ................................ 2020-164643

(51) Int. Cl.
*H01L 21/02* (2006.01)
(52) U.S. Cl.
CPC ................ *H01L 21/0223* (2013.01)
(58) Field of Classification Search
None
See application file for complete search history.

(56) References Cited

U.S. PATENT DOCUMENTS

2008/0132083 A1\* 6/2008 Matsuura .......... C23C 16/45546
438/770
2009/0258506 A1 10/2009 Hirano
(Continued)

FOREIGN PATENT DOCUMENTS

| CN | 113871288 A | 12/2021 |
| JP | 2003-188159 A | 7/2003 |

(Continued)

OTHER PUBLICATIONS

Singapore Search Report issued on Jan. 20, 2023 for Singapore Patent Application No. 10202110267Y.
(Continued)

*Primary Examiner* — Khaja Ahmad
(74) *Attorney, Agent, or Firm* — Volpe Koenig

(57) ABSTRACT

There is included (a) loading a substrate into a process container; (b) performing a process of forming a film on the substrate in the process container by alternately or simultaneously performing, a predetermined number of times, supplying a precursor gas from a first supplier to the substrate, and supplying a reaction gas from a second supplier to the substrate; (c) unloading the processed substrate from an interior of the process container; and (d) oxidizing at least one part of a film formed inside the process container in (b) so as to change the at least one part into an oxide film in a state in which the processed substrate is unloaded from the interior of the process container, wherein in (d), an oxygen-containing gas and a hydrogen-containing gas are supplied into the process container and at that time, the hydrogen-containing gas is supplied toward the first supplier.

20 Claims, 8 Drawing Sheets

(56) References Cited

U.S. PATENT DOCUMENTS

| | | | |
|---|---|---|---|
| 2010/0189927 A1 | 7/2010 | Sato et al. | |
| 2011/0059600 A1* | 3/2011 | Sakai | H01L 21/67028 |
| | | | 438/584 |
| 2013/0252434 A1* | 9/2013 | Yuasa | H01L 21/0228 |
| | | | 118/724 |
| 2013/0260566 A1* | 10/2013 | Yamazaki | C23C 16/54 |
| | | | 134/22.18 |
| 2015/0031216 A1* | 1/2015 | Akae | C23C 16/345 |
| | | | 118/704 |
| 2016/0064219 A1 | 3/2016 | Yamamoto et al. | |
| 2016/0362784 A1* | 12/2016 | Isobe | C23C 16/405 |
| 2017/0298508 A1* | 10/2017 | Yamakoshi | H01L 21/0228 |
| 2019/0055647 A1 | 2/2019 | Chung et al. | |
| 2021/0407774 A1 | 12/2021 | Imamura et al. | |

FOREIGN PATENT DOCUMENTS

| | | |
|---|---|---|
| JP | 2008-140864 A | 6/2008 |
| JP | 2009-033121 A | 2/2009 |
| JP | 2010-219308 A | 9/2010 |
| JP | 2013-225653 A | 10/2013 |
| JP | 2016-051864 A | 4/2016 |
| KR | 10-2013-0108181 A | 10/2013 |

OTHER PUBLICATIONS

Singapore Written Opinion issued on Jan. 20, 2023 for Singapore Patent Application No. 10202110267Y.
Japanese Office Action issued on Aug. 23, 2022 for Japanese Patent Application No. 2020-164643.
Taiwan Office Action issued on Apr. 27, 2022 for Taiwan Patent Application No. 110131662.
Korean Office Action issued on Nov. 13, 2023 for Korean Patent Application No. 10-2021-0124232.
Chinese Office Action issued on Sep. 15, 2023 for Chinese Patent Application No. 202111082924.7.

* cited by examiner

SUBSTRATE PROCESSING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-164643, filed on Sep. 30, 2020, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

As a process of manufacturing a semiconductor device, a film-forming process of forming a film on a substrate in a process container may be performed. When performing the film-forming process, a film is also formed inside the process container. By repeating the film-forming process, the film is cumulatively deposited inside the process container. If the thickness of the cumulative film formed inside the process container exceeds a critical film thickness, cracks and film peeling occur in the film, thereby generating particles and leading to contamination of foreign substances. For that reason, the interior of the process container may be regularly cleaned to remove the cumulative film. However, during the cleaning, the film-forming process cannot be performed. If a cleaning frequency is high, that is, if the cleaning cycle is short, the productivity of the film-forming process may decrease.

SUMMARY

Some embodiments of the present disclosure provide a technique capable of prolonging the cleaning cycle and improving the productivity of a film-forming process by properly suppressing the generation of particles due to a film formed inside a process container.

According to the embodiments of the present disclosure, there is provided a technique that includes:
  (a) loading a substrate into a process container;
  (b) performing a process of forming a film on the substrate in the process container by alternately or simultaneously performing, a predetermined number of times:
    supplying a precursor gas from a first supplier to the substrate; and
    supplying a reaction gas from a second supplier to the substrate;
  (c) unloading the processed substrate from an interior of the process container; and
  (d) oxidizing at least one part of a film formed inside the process container in (b) so as to change the at least one part into an oxide film in a state in which the processed substrate is unloaded from the interior of the process container,
wherein in (d), an oxygen-containing gas and a hydrogen-containing gas are supplied into the process container and at that time, the hydrogen-containing gas is supplied toward the first supplier.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Hereinafter, embodiments of the present disclosure will be described mainly with reference to FIGS. 1 to 4.

(1) Configuration of Substrate Processing Apparatus

Figure 1:
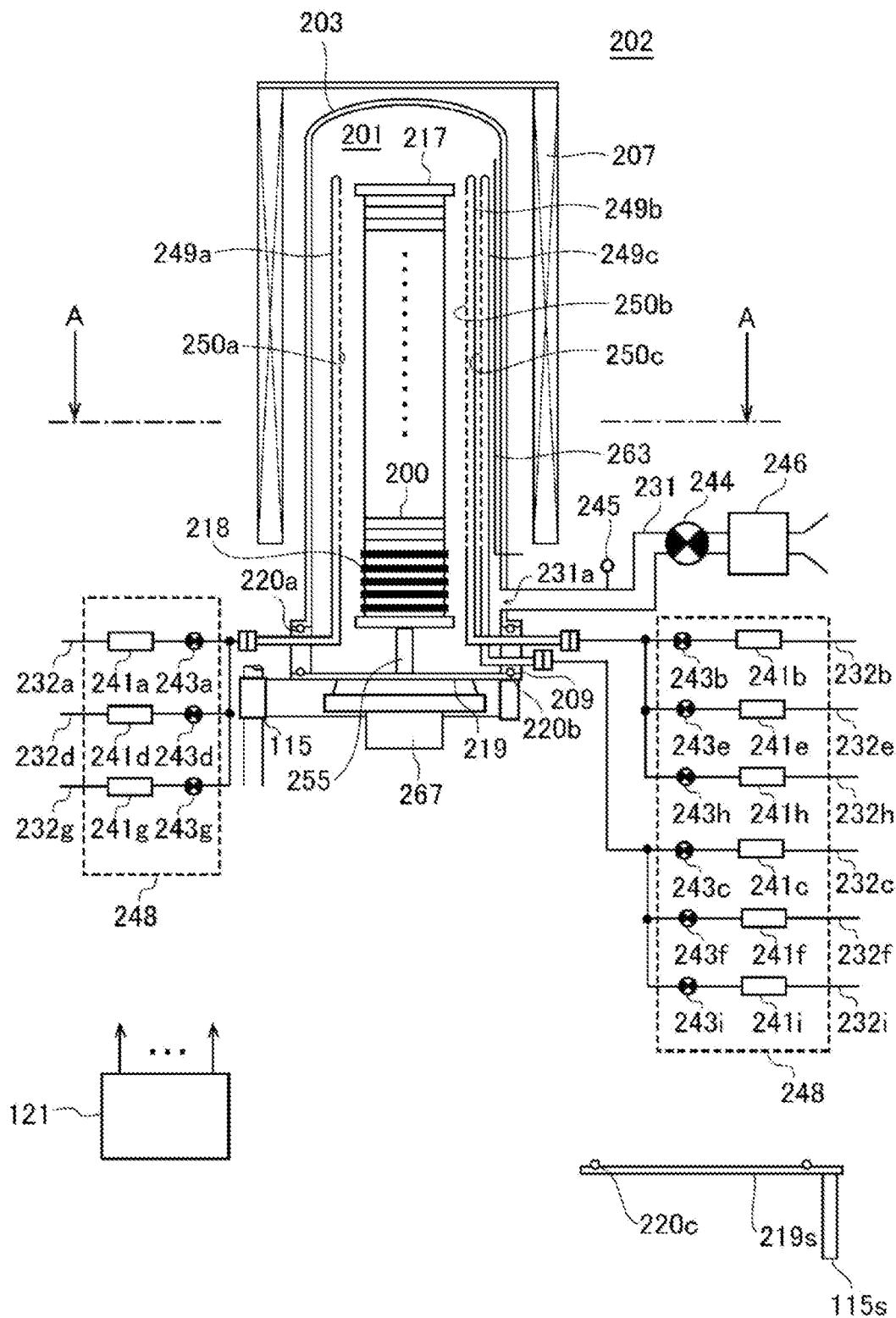
FIG. 1 is a schematic configuration diagram of a vertical process furnace of a substrate processing apparatus suitably used in embodiments of the present disclosure, in which a portion of a process furnace 202 is illustrated in a vertical cross-sectional view.

As shown in FIG. 1, a process furnace 202 includes a heater 207 as a temperature regulator (heating part). The heater 207 has a cylindrical shape and is vertically installed by being supported by a holding plate. The heater 207 also functions as an activation mechanism (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC), and is formed in a cylindrical shape with an upper end thereof closed and a lower end thereof opened. Below the reaction tube 203, a manifold 209 is arranged concentrically with the reaction tube 203. The manifold 209 is made of a metallic material such as stainless steel (SUS) or the like, and is formed in a cylindrical shape with upper and lower ends thereof opened. The upper end of the manifold 209 is engaged with the lower end of the reaction tube 203 and is configured to support the reaction tube 203. An O-ring 220a as a seal member is installed between the manifold 209 and the reaction tube 203. The reaction tube 203 is vertically installed similar to the heater 207. A process container (reaction container) is mainly composed of the reaction tube 203 and the manifold 209. A process chamber 201 is formed in a hollow portion of the process container. The process chamber 201 is configured to be capable of accommodating wafers 200 as substrates. The wafers 200 are processed in the process chamber 201. The wafers 200 include product wafers as product substrates and dummy wafers as dummy substrates. The dummy wafers include side dummy wafers arranged at ends of regions where the product wafers are arranged and fill dummy wafers arranged at a portion where the product wafers are not charged.

Nozzles 249a to 249c as suppliers are installed in the process chamber 201 so as to penetrate the side wall of the manifold 209. The nozzles 249a to 249c are also referred to as first to third nozzles, respectively. The nozzles 249a to 249c are respectively made of a heat-resistant material such as, for example, quartz or SiC. Gas supply pipes 232a to 232c are connected to the nozzles 249a to 249c, respectively. Further, the nozzle 249a is referred to as a first supplier. In addition, the nozzle 249b is referred to as a second supplier. Also, the nozzle 249c is also referred to as a second supplier. That is, there is installed a plurality of second suppliers.

At the gas supply pipes 232a to 232c, mass flow controllers (MFCs) 241a to 241c, which are flow rate controllers (flow rate control parts) and valves 243a to 243c, which are opening/closing valves, are installed, respectively, sequentially from the upstream side of a gas flow. Gas supply pipes 232d and 232g are connected to the gas supply pipe 232a on the downstream side of the valve 243a. Gas supply pipes 232e and 232h are respectively connected to the gas supply pipe 232b at the downstream side of the valve 243b. Gas supply pipes 232f and 232i are respectively connected to the gas supply pipe 232c at the downstream side of the valve 243c. At the gas supply pipes 232d to 232i, MFCs 241d to 241i and valves 243d to 243i are installed, respectively, sequentially from the upstream side of a gas flow. The gas supply pipes 232a to 232i are made of a metallic material such as, for example, SUS or the like.

Figure 2:
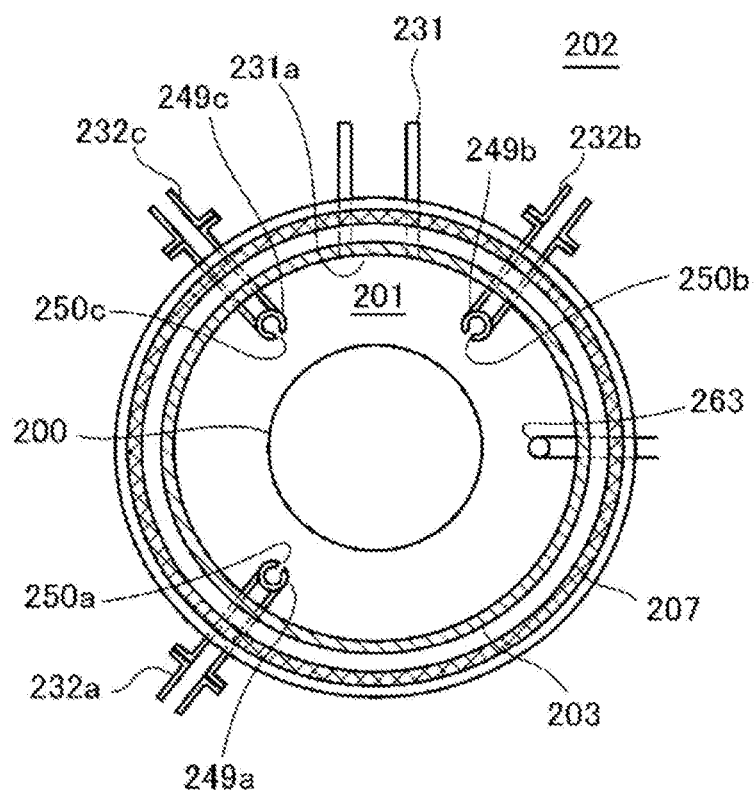
FIG. 2 is a schematic configuration diagram of a vertical process furnace of a substrate processing apparatus suitably used in embodiments of the present disclosure, in which a portion of the process furnace 202 is illustrated in a cross-sectional view taken along a line A-A in FIG. 1.

As shown in FIG. 2, the nozzles 249a to 249c are installed at a space having an annular shape in a plane view between the inner wall of the reaction tube 203 and the wafers 200 so as to extend upward in the arrangement direction of the wafers 200 from the lower portion to the upper portion of the inner wall of the reaction tube 203. In other words, the nozzles 249a to 249c are respectively installed at a lateral side of a wafer arrangement region at which the wafers 200 are arranged, namely at a region horizontally surrounding the wafer arrangement region, so as to extend along the wafer arrangement region.

The nozzle 249a is arranged on the side farther from an exhaust port 231a to be described below than the nozzles 249b and 249c. That is, the nozzles 249b and 249c are arranged closer to the exhaust port 231a than the nozzle 249a. Further, in a plane view, the nozzles 249b and 249c are arranged line-symmetrically with respect to a straight line as a symmetrical axis passing through a center of the wafer 200 loaded into the process chamber 201, that is, a center of the reaction tube 203 and a center of the exhaust port 231a. Further, the nozzle 249a, which is the first supplier, and the nozzle 249b, which is one of the second suppliers, are arranged on a straight line so as to face each other with the center of the reaction tube 203 interposed therebetween. That is, the nozzle 249b, which is one of the nozzles 249b and 249c that are the plurality of second suppliers, is arranged so as to face the nozzle 249a, which is the first supplier.

Gas supply holes 250a to 250c configured to supply gases are installed at side surfaces of the nozzles 249a to 249c, respectively. The gas supply holes 250a to 250c are respectively opened to face the center of the reaction tube 203, and are configured to be capable of supplying gases toward the wafers 200. The gas supply holes 250a and 250b are opened to face each other on a straight line across the centers of the wafers 200, that is, the center of the reaction tube 203. The gas supply holes 250a to 250c are installed in a plural number between a lower portion of the reaction tube 203 and an upper portion of the reaction tube 203.

From the gas supply pipe 232a, a precursor gas is supplied into the process chamber 201 via the MFC 241a, the valve 243a, and the nozzle 249a.

From the gas supply pipes 232b and 232c, a reaction gas is supplied into the process chamber 201 via the MFCs 241b and 241c, the valves 243b and 243c, and the nozzles 249b and 249c.

From the gas supply pipe 232d, a cleaning gas is supplied into the process chamber 201 via the MFC 241d, the valve 243d, the gas supply pipe 232a, and the nozzle 249a.

From the gas supply pipe 232f, for example, an oxygen (O)-containing gas as an oxidizing gas (oxidizing agent) is supplied into the process chamber 201 via the MFC 241f, the valve 243f, the gas supply pipe 232c, and the nozzle 249c.

From the gas supply pipe 232e, for example, a hydrogen (H)-containing gas as a reducing gas (reducing agent) is supplied into the process chamber 201 via the MFC 241e, the valve 243e, the gas supply pipe 232b, and the nozzle 249b. Although the H-containing gas alone does not have an oxidizing action, the H-containing gas reacts with the O-containing gas under a specific condition to generate oxidizing species such as atomic oxygen (O) or the like, and acts to improve an efficiency of an oxidizing process.

From the gas supply pipes 232g to 232i, an inert gas is supplied into the process chamber 201 via the MFCs 241g to 241i, the valves 243g to 243i, the gas supply pipes 232a to 232c, and the nozzles 249a to 249c, respectively. The inert gas acts as a purge gas, a carrier gas, a diluting gas or the like.

A precursor gas supply system is mainly constituted by the gas supply pipe 232a, the MFC 241a, and the valve 243a. A reaction gas supply system is mainly constituted by the gas supply pipes 232b and 232c, the MFCs 241b and 241c, and the valves 243b and 243c. An oxidizing gas supply system (O-containing gas supply system) is mainly constituted by the gas supply pipe 232f, the MFC 241f, and the valve 243f. A reducing gas supply system (H-containing gas supply system) is mainly constituted by the gas supply pipe 232e, the MFC 241e, and the valve 243e. A cleaning gas supply system is mainly constituted by the gas supply pipe 232d, the MFC 241d, and the valve 243d. An inert gas supply system is mainly constituted by the gas supply pipes 232g to 232i, the MFCs 241g to 241i, and the valves 243g to 243i.

Each or both of the precursor gas and the reaction gas may also be referred to as a film-forming gas, and each or both of the precursor gas supply system and the reaction gas supply system may also be referred to as a film-forming gas supply system. Further, each or both of the O-containing gas and the H-containing gas may also be referred to as an oxidizing gas, and each or both of the O-containing gas supply system and the H-containing gas supply system may also be referred to as an oxidizing gas supply system.

One or all of the above-described various gas supply systems may be configured as an integrated gas supply system 248 in which the valves 243a to 243i, the MFCs 241a to 241i, and the like are integrated. The integrated gas supply system 248 is connected to each of the gas supply pipes 232a to 232i and is configured such that operations of supplying various gases into the gas supply pipes 232a to 232i, that is, an operation of opening and closing the valves 243a to 243i, an operation of regulating the flow rate by the MFCs 241a to 241i, and the like are controlled by the controller 121 which will be described later. The integrated gas supply system 248 is formed of integral type or a division type integrated units and may be attached to and detached from the gas supply pipes 232a to 232i and the like on an integrated unit basis. The integrated gas supply system 248 is configured, such that the maintenance, replacement, expansion and the like of the integrated gas supply system 248 can be performed on an integrated unit basis.

The exhaust port 231a configured to exhaust an atmosphere of the interior of the process chamber 201 is installed at the lower portion of the side wall of the reaction tube 203. The exhaust port 231a may be installed to extend from the lower portion to the upper portion of the side wall of the reaction tube 203, that is, along the wafer arrangement region. An exhaust pipe 231 is connected to the exhaust port 231a. The exhaust pipe 231 is made of a metallic material such as stainless steel or the like. A vacuum pump 246 as an exhaust device is connected to the exhaust pipe 231 via a pressure sensor 245 as a pressure detector (pressure detection part) for detecting the pressure in the process chamber 201 and an APC (Auto Pressure Controller) valve 244 as a pressure regulator (pressure regulation part). The APC valve 244 is configured so that it can perform or stop vacuum exhaust of the interior of the process chamber 201 by being opened and closed in a state in which the vacuum pump 246 is operated. Furthermore, the APC valve 244 is configured so that it can regulate the pressure in the process chamber 201 by adjusting the valve opening degree based on the pressure information detected by the pressure sensor 245 in a state in which the vacuum pump 246 is operated. The APC valve 244 is also referred to as an exhaust valve. An exhaust system is mainly constituted by the exhaust pipe 231, the APC valve 244 and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of a metallic material such as, for example, stainless steel or the like, and is formed in a disc shape. On the upper surface of the seal cap 219, there is installed an O-ring 220b as a seal member which abuts against the lower end of the manifold 209. Below the seal cap 219, there is installed a rotation mechanism 267 for rotating a boat 217 to be described later. A rotating shaft 255 of the rotation mechanism 267 is made of, for example, a metallic material such as stainless steel or the like and is connected to the boat 217 through the seal cap 219. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transporter (transport mechanism) that loads and unloads (transports) the wafers 200 into and out of the process chamber 201 by raising and lowering the seal cap 219.

Figure 5:
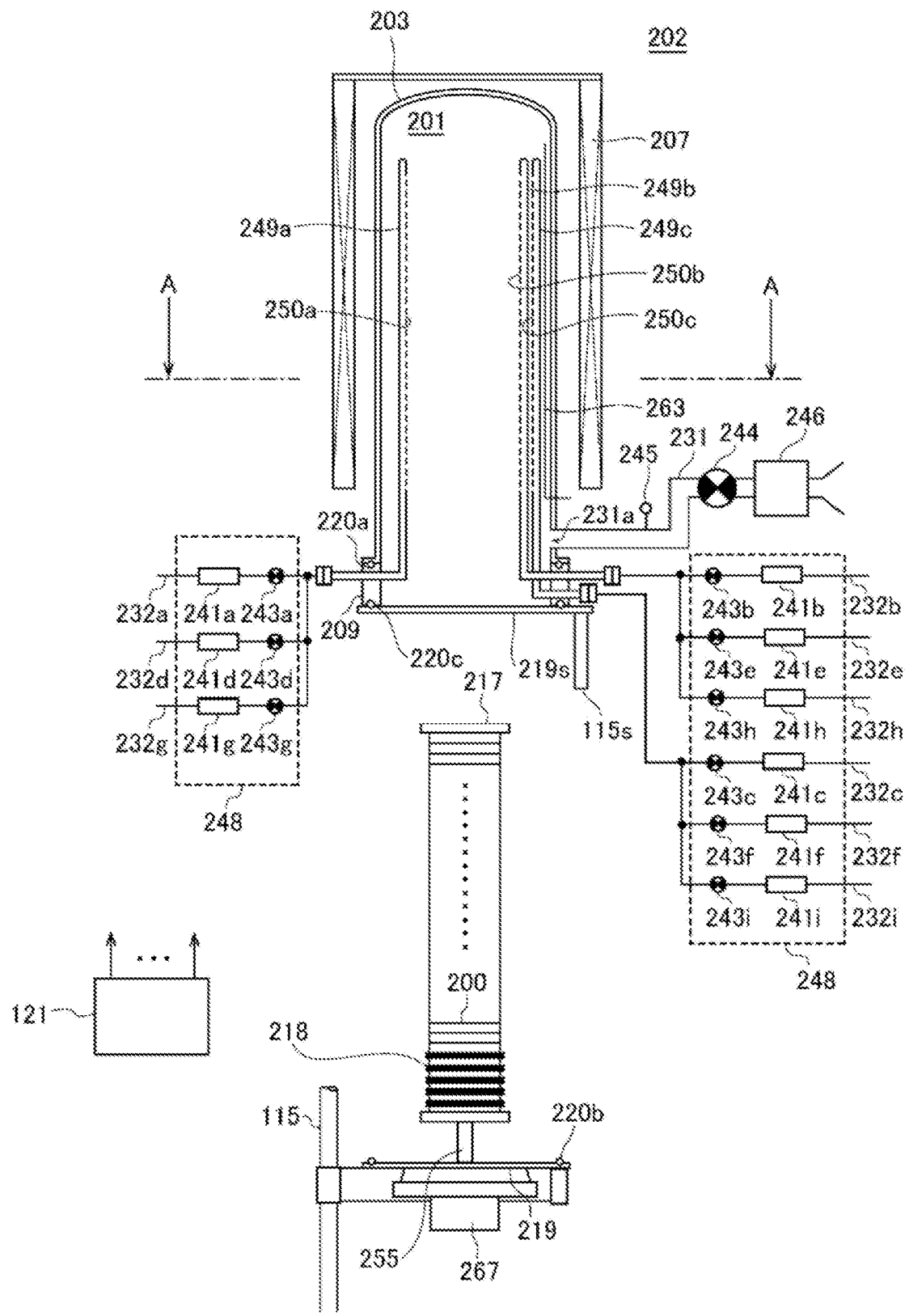
FIG. 5 is a schematic configuration diagram of a vertical process furnace of a substrate processing apparatus suitably used in embodiments of the present disclosure, in which a portion of a process furnace 202 with a support unloaded is illustrated in a vertical cross-sectional view.

Below the manifold 209, a shutter 219s is installed as a furnace opening lid capable of airtightly closing the lower end opening of the manifold 209 in a state in which the seal cap 219 is lowered and the boat 217 is unloaded from the process chamber 201. FIG. 5 shows a state in which the lower end opening of the manifold 209 is closed by the shutter 219s while lowering the seal cap 219 to unload the boat 217 from the process chamber 201. The shutter 219s is made of a metallic material such as stainless steel or the like and is formed in a disk shape. An O-ring 220c as a seal member that comes into contact with the lower end of the manifold 209 is installed on the upper surface of the shutter 219s. The opening/closing operations (the elevating operation, the rotating operation, and the like) of the shutter 219s are controlled by a shutter opening/closing mechanism 115s.

A boat 217 as a substrate support tool for supporting the substrates is configured so as to support a plurality of wafers 200, for example, 25 to 200 wafers 200 in a horizontal posture and in multiple stages while vertically arranging the wafers 200 with the centers thereof aligned with each other, that is, so as to arrange the wafers 200 at intervals. The boat 217 is made of a heat-resistant material such as, for example, quartz or SiC. Heat insulating plates 218 made of a heat-resistant material such as, for example, quartz or SiC, are supported in multiple stages at the bottom of the boat 217.

Inside the reaction tube 203, there is installed a temperature sensor 263 as a temperature detector. By adjusting the state of supply of electric power to the heater 207 based on the temperature information detected by the temperature sensor 263, the temperature inside the process chamber 201 becomes a desired temperature distribution. The temperature sensor 263 is installed along the inner wall of the reaction tube 203.

Figure 3:
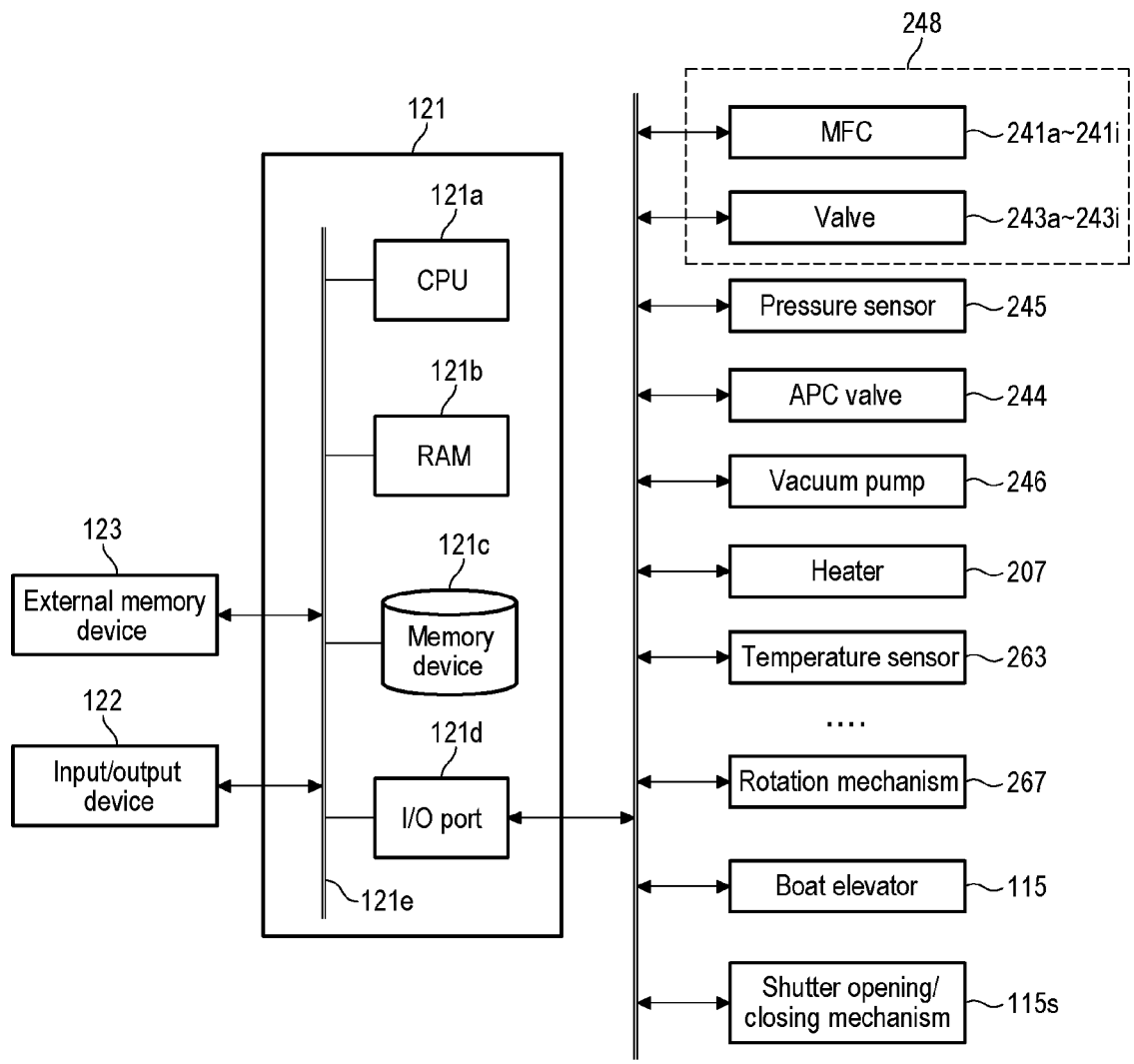
FIG. 3 is a schematic configuration diagram of a controller 121 of a substrate processing apparatus suitably used in embodiments of the present disclosure, in which a control system of the controller 121 is illustrated in a block diagram.

As shown in FIG. 3, the controller 121 as a control part (control means) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), an SSD (Solid State Drive), or the like. In the memory device 121c, there are readably stored a control program for controlling the operation of the substrate processing apparatus, a process recipe in which procedures and conditions of a process to be described later are written, and the like. The process recipe is a combination for causing the controller 121 to enable the substrate processing apparatus to execute the respective procedures in a below-described process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data and the like read by the CPU 121a are temporarily held.

The I/O port 121d is connected to the MFCs 241a to 241i, the valves 243a to 243i, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read and execute the control program from the memory device 121c and to read the recipe from the memory device 121c in response to an input of an operation command from the input/output device 122 or the like. The CPU 121a is configured to, according to the contents of the recipe thus read, control the flow rate adjustment operation of various gases by the MFCs 241a to 241h, the opening/closing operations of the valves 243a to 243h, the opening/closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotation mechanism 267, the raising and lowering operation of the boat 217 by the boat elevator 115, the opening/closing operation of the shutter 219s by the shutter opening/closing mechanism 115s, and the like.

The controller 121 may be configured by installing, in the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory, an SSD or the like, and so forth. The memory device 121c and the external memory device 123 are configured as a computer readable recording medium. Hereinafter, the memory device 121c and the external memory device 123 are collectively and simply referred to as a recording medium. As used herein, the term "recording medium" may include only the memory device 121c, only the external memory device 123, or both. The provision of the program to the computer may be performed by using a communication means such as the Internet or a dedicated line without having to use the external memory device 123.

(2) Processing Process

Figure 4:
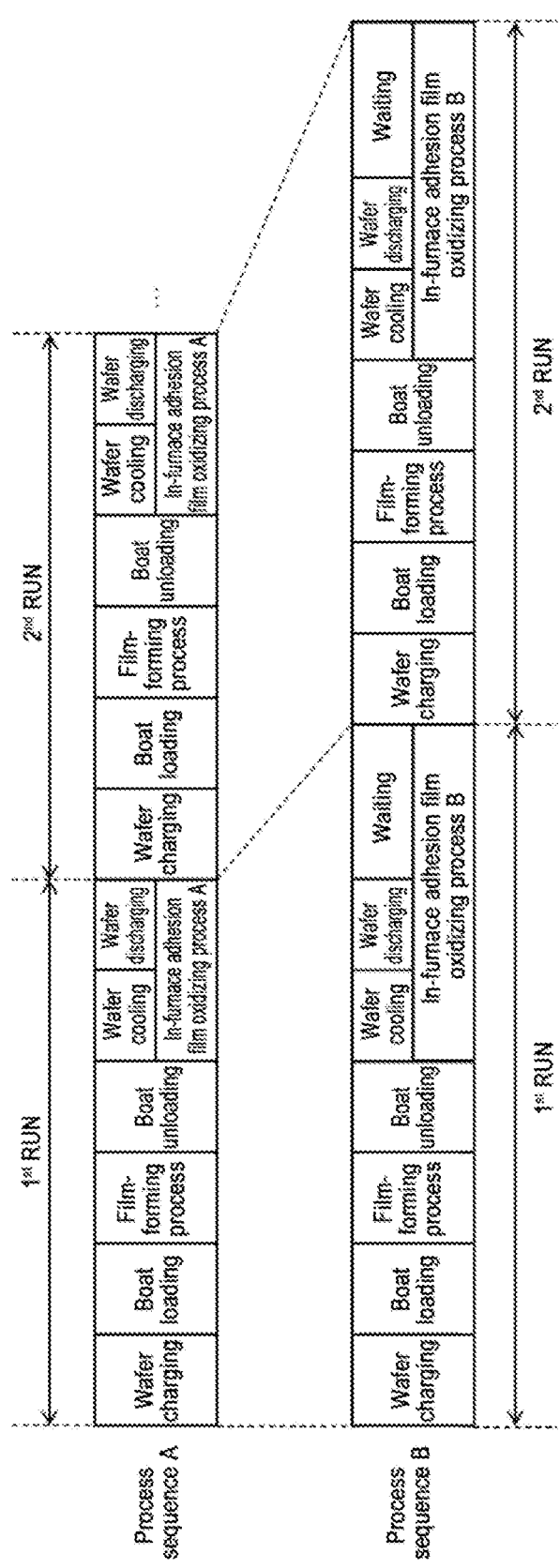
FIG. 4 is a diagram showing a comparison between a process sequence (process sequence A) in embodiments of the present disclosure and a process sequence (process sequence B) in a comparative example.
Figure 8:
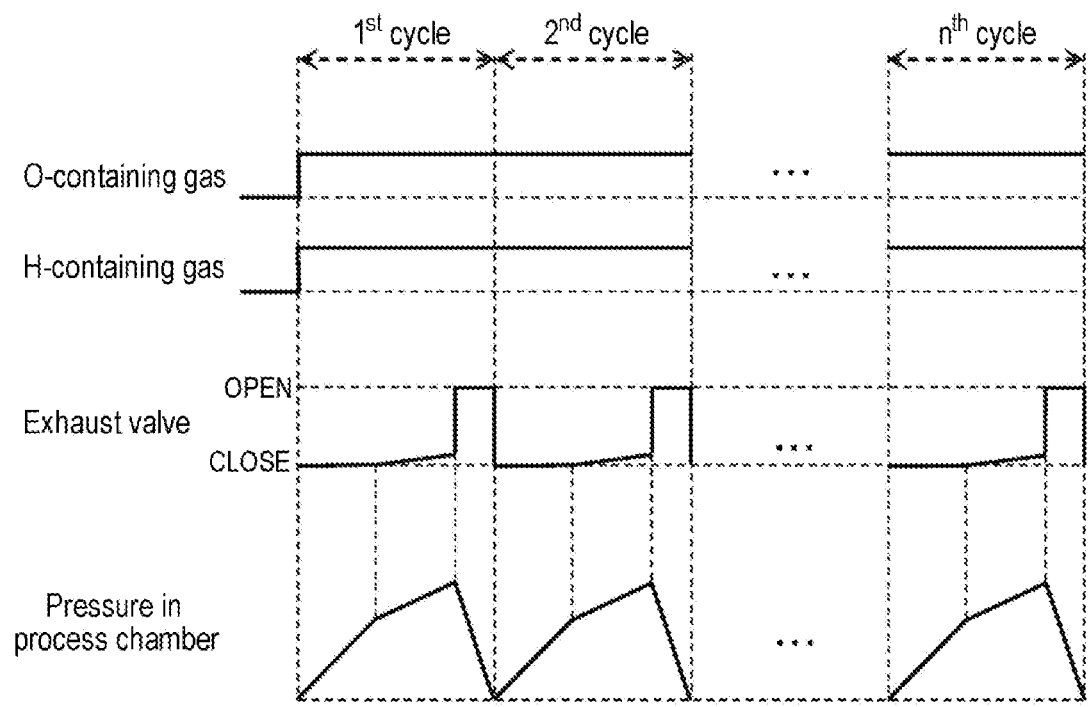
FIG. 8 is a diagram showing a sequence of an in-furnace adhesion film oxidizing process in embodiments of the present disclosure.

As a process of manufacturing a semiconductor device by using the above-described substrate processing apparatus, a process sequence example that performs a set a predetermined number of times, specifically, a plurality of times, the set including a step of performing a process of forming a film on a wafer 200 as a substrate in a process container and a step of oxidizing one part of a film formed inside the process container after performing the process so as to change the one part into an oxide film, will be described mainly with reference to FIGS. 4 and 8. In the following description, the operation of each part constituting the substrate processing apparatus is controlled by the controller 121.

The film-forming sequence according to the embodiments of the present disclosure includes:

(a) loading a wafer 200 into a process container;
(b) performing a process of forming a film on the wafer 200 in the process container by alternately or simultaneously performing, a predetermined number of times, a step of supplying a precursor gas to the wafer 200 from the nozzle 249a as a first supplier and a step of supplying a reaction gas to the wafer 200 from the nozzle 249b as a second supplier;
(c) unloading the processed wafer 200 from the interior of the process container; and
(d) oxidizing at least one part of a film formed inside the process container in (b) so as to change the at least one part into an oxide film in a state in which the processed wafer 200 is unloaded from the interior of the process container,
wherein in (d), an O-containing gas and an H-containing gas are supplied into the process container and at that time, the H-containing gas is supplied toward the nozzle 249a as the first supplier.

In (d), it is desirable that the H-containing gas is supplied toward the nozzle 249a from a position facing the nozzle 249a as the first supplier. Further, in (d), specifically, an oxidization amount of a film formed on the nozzle 249a as the first supplier and its periphery inside the process container is made larger than an oxidization amount of a film formed on other portions (e.g., the second supplier and its periphery) inside the process container. That is, in (d), it is desirable that the oxide film formed by oxidizing the film formed on the nozzle 249a as the first supplier and its periphery inside the process container is made thicker than the oxide film formed by oxidizing the film formed on other portions (e.g., the second supplier and its periphery) inside the process container. Further, it is desirable that the O-containing gas and the H-containing gas are supplied from any of the nozzles 249b and 249c as the second suppliers. For example, in (d), it is desirable that the H-containing gas is supplied toward the nozzle 249a from the nozzle 249b as the second supplier located at a position facing the nozzle 249a as the first supplier. In this case, in (d), it is desirable that the O-containing gas is supplied from the nozzle 249c as the second supplier located at a position not facing the nozzle 249a as the first supplier. These are particularly effective in the case where in (a), the film formed on the nozzle 249a as the first supplier and its periphery inside the process is made thicker than the film formed on other portions (e.g., the second supplier and its periphery) inside the process container. Further, these are particularly effective in the case where in (a), the film formed on the nozzle 249a as the first supplier and its periphery inside the process container has a different composition from the film formed on other portions (e.g., the second supplier and its periphery) inside the process container. Specifically, for example, these are particularly effective in the case where in (a), the film formed on the nozzle 249a as the first supplier and its periphery inside the process container becomes richer in an element (e.g., silicon) contained in the precursor gas than the film formed on other portions (e.g., the second supplier and its periphery) inside the process container.

Further, in the process sequence according to the embodiments, a set in which (a), (b), (c), and (d) are performed in the named order is repeated multiple times. That is, in the process sequence according to the embodiments, (d) is performed every time whenever (a), (b), and (c) are performed. That is, in the process sequence according to the embodiments, (d) is performed every time whenever a process of forming a film on the wafer 200 by (a), (b), and (c) is performed.

In the following, an example of forming a nitride film as the film will be described. As referred to herein, the nitride film includes not only a silicon nitride film (SiN film) but also a nitride film containing carbon (C), oxygen (O), boron (B) and the like. That is, the nitride film includes a silicon nitride film (SiN film), a silicon carbonitride film (SiCN film), a silicon oxynitride film (SiON film), a silicon oxycarbonitride film (SiOCN film), a silicon borocarbonitride film (SiBCN film), a silicon boronitride film (SiBN film), a silicon borooxycarbonitride film (SiBOCN film), a silicon borooxynitride film (SiBON film), and the like. In the embodiments to be described below, an example in which a SiN film is formed as the nitride film will be described.

Further, hereinafter, an example of performing a cycle a predetermined number of times (m times where m is 1 or more) in (b), the cycle including the step of supplying the raw material gas to the wafer 200 and the step of supplying the reaction gas to the wafer 200, will be described. The step of supplying the raw material gas and the step of supplying the reaction gas may be performed alternately, that is, non-simultaneously, or these steps may be performed simultaneously. In the following, an example of alternately performing these steps will be described. In the present disclosure, such a gas supply sequence may be denoted as follows for the sake of convenience. The same notation is used in the following description of other embodiments and modifications.

(precursor gas→reaction gas)×m

Further, in the following, there will be described an example in which in (d), by supplying an O-containing gas and an H-containing gas as the oxidizing gas into the process container which is in a heated state and at a pressure below an atmospheric pressure (reduced pressure) after the processed wafer 200 is unloaded, one part of the film formed inside the process container in (b) is oxidized so as to change the one part into an oxide film and the other part different from the one part of the film is maintained as it is without being oxidized.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

(Wafer Charging)

A plurality of wafers 200 is charged into the boat 217 (wafer charging). Thereafter, the shutter 219s is moved by the shutter opening/closing mechanism 115s to open the lower end opening of the manifold 209 (shutter opened). As described above, the wafers 200 include product wafers and dummy wafers. That is, the boat 217 is charged with product wafers and dummy wafers as the wafers 200.

(Boat Loading)

Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b.

(Pressure Regulation and Temperature Adjustment)

After the boat loading is completed, the interior of the process chamber 201, that is, the space where the wafers 200 exist, is vacuum-exhausted (depressurization-exhausted) by the vacuum pump 246 so as to have a desired pressure (vacuum degree). At this time, the pressure in the process chamber 201 is measured by the pressure sensor 245, and the APC valve 244 is feedback-controlled based on the measured pressure information (pressure regulation). Further, the wafers 200 in the process chamber 201 are heated by the heater 207 so as to have a desired process temperature. At this time, an amount of a current supplied to the heater 207 is feedback-controlled based on the temperature information detected by the temperature sensor 263 so that the interior of the process chamber 201 has a desired temperature distribution (temperature adjustment). Moreover, the rotation mechanism 267 starts the rotation of the wafers 200. The exhaust of the process chamber 201 and the heating and rotation of the wafers 200 are all continuously performed at least until the processing of the wafers 200 is completed.

(Film-Forming Process)

Thereafter, the following steps 1 and 2 are executed in sequence.

[Step 1]

In step 1, the precursor gas is supplied to the wafer 200 in the process chamber 201.

Specifically, the valve 243a is opened to allow the precursor gas to flow into the gas supply pipe 232a. The flow rate of the precursor gas is adjusted by the MFC 241a. The precursor gas is supplied into the process chamber 201 via the nozzle 249a, and is exhausted from the exhaust port 231a. At this time, the precursor gas is supplied to the wafer 200 (precursor gas supply). At this time, the valves 243g to 243i may be opened to supply an inert gas into the process chamber 201 via the nozzles 249a to 249c.

An example of a processing condition in this step is described as follows.

Processing temperature (temperature of wafer 200): 400 to 700 degrees C., specifically 500 to 650 degrees C.

Processing pressure (pressure in process chamber 201): 1 to 2,666 Pa, specifically 67 to 1,333 Pa Precursor gas supply flow rate: 0.01 to 2 slm, specifically 0.1 to 1 slm Precursor gas supply time: 1 to 120 seconds, specifically 1 to 60 seconds Inert gas supply flow rate (for each gas supply pipe): 0 to 10 slm The notation of a numerical range such as "1 to 2,666 Pa" or the like in the subject specification means that the lower limit value and the upper limit value are included in the range. Therefore, for example, "1 to 2,666 Pa" means "1 Pa or more and 2,666 Pa or less". The same applies to other numerical ranges. Further, as used herein, the term processing temperature refers to the temperature of the wafer 200 or the temperature in the process chamber 201, and the term processing pressure refers to the pressure in the process chamber 201. Moreover, "the gas supply flow rate: 0 sccm"

refers to a case where the gas is not supplied. The same applies to other numerical ranges to be described below.

By supplying the precursor gas, for example, a chlorosilane-based gas to the wafers 200 under the above condition, a Si-containing layer containing Cl is formed on the outermost surface of the wafer 200 as a base. The Si-containing layer containing Cl is formed by physical adsorption or chemical adsorption of molecules of the chlorosilane-based gas onto the outermost surface of the wafer 200, physical adsorption or chemical adsorption of molecules of a substance generated by decomposition of a part of the chlorosilane-based gas, or the like. The Si-containing layer containing Cl may be an adsorption layer (physical adsorption layer or chemical adsorption layer) of molecules of the chlorosilane-based gas or molecules of a substance generated by decomposition of a part of the chlorosilane-based gas, or may be a deposition layer of Si containing Cl. In the present disclosure, the Si-containing layer containing Cl is also simply referred to as a Si-containing layer.

After the Si-containing layer is formed, the valve 243a is closed to stop the supply of the precursor gas into the process chamber 201. Then, the process chamber 201 is vacuum-exhausted, and the gas or the like remaining in the process chamber 201 is removed from the interior of the process chamber 201 (purge). At this time, the valves 243g to 243i are opened to supply the inert gas into the process chamber 201. The inert gas acts as a purge gas.

As the precursor gas, it may be possible to use, for example, a silane-based gas containing silicon (Si) as a main element constituting the film formed on the wafer 200. As the silane-based gas, it may be possible to use, for example, a gas containing Si and halogen, that is, a halosilane-based gas. Halogen includes chlorine (Cl), fluorine (F), bromine (Br), iodine (I) and the like. As the halosilane-based gas, it may be possible to use, for example, the above-mentioned chlorosilane-based gas containing Si and Cl.

As the precursor gas, it may be possible to use, for example, a chlorosilane-based gas such as a monochlorosilane ($SiH_3Cl$, abbreviated as MCS) gas, a dichlorosilane ($SiH_2Cl_2$, abbreviated as DCS) gas, a trichlorosilane ($SiHCl_3$, abbreviated as TCS) gas, a tetrachlorosilane ($SiCl_4$, abbreviated as STC) gas, a hexachlorodisilane gas ($Si_2Cl_6$, abbreviated as HCDS) gas, an octachlorotrisilane ($Si_3Cl_8$, abbreviated as OCTS) gas, and the like. One or more of these gases may be used as the precursor gas.

As the precursor gas, in addition to the chlorosilane-based gas, it may be possible to use, for example, a fluorosilane-based gas such as a tetrafluorosilane ($SiF_4$) gas, a difluorosilane ($SiH_2F_2$) gas or the like, a bromosilane-based gas such as a tetrabromosilane ($SiBr_4$) gas, a dibromosilane ($SiH_2Br_2$) gas or the like, and an iodosilane-based gas such as a tetraiodosilane ($SiI_4$) gas, a diiodosilane ($SiH_2I_2$) gas or the like. One or more of these gases may be used as the precursor gas.

As the precursor gas, in addition to these gases, it may be possible to use, for example, a gas containing Si and an amino group, that is, an aminosilane-based gas. The amino group is a monovalent functional group obtained by removing hydrogen (H) from ammonia, a primary amine or a secondary amine, and may be expressed as $—NH_2$, $—NHR$ and $—NR_2$. In addition, R represents an alkyl group, and two Rs of $—NR_2$ may be the same or different.

As the precursor gas, it may be possible to use, for example, an aminosilane-based gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tertiary-butylamino)silane ($SiH_2[NH(C_4H_9)]_2$, abbreviation: BTBAS) gas, a (diisopropylamino)silane ($SiH_3[N(C_3H_7)_2]$, abbreviation: DIPAS) gas or the like. One or more of these gases may be used as the precursor gas.

As the inert gas, it may be possible to use, for example, a rare gas such as a nitrogen ($N_2$) gas, an argon (Ar) gas, a helium (He) gas, a neon (Ne) gas, a xenon (Xe) gas or the like. One or more of them may be used as the inert gas. This point holds true in each step described later.

[Step 2]

After step 1 is completed, a reaction gas is supplied to the wafer 200 in the process chamber 201, that is, the Si-containing layer formed on the wafer 200.

Specifically, the valves 243b and 243c are opened to allow the reaction gas to flow into the gas supply pipes 232b and 232c. The flow rate of the reaction gas is adjusted by the MFCs 241b and 241c. The reaction gas is supplied into the process chamber 201 via the nozzles 249b and 249c, and is exhausted from the exhaust port 231a. At this time, the reaction gas is supplied to the wafer 200 (reaction gas supply). At this time, the valves 243g to 243i may be opened to supply an inert gas into the process chamber 201 via the nozzles 249a to 249c. At this time, the reaction gas may be supplied from the nozzle 249b without supplying the reaction gas from the nozzle 249c, or the reaction gas may be supplied from the nozzle 249c without supplying the reaction gas from the nozzle 249b. That is, the reaction gas may be supplied from at least one selected from the group of the nozzles 249b and 249c.

An example of a processing condition is described as follows.

Processing temperature (temperature of wafer 200): 400 to 700 degrees C., specifically 500 to 650 degrees C.

Processing pressure (pressure in process chamber 201): 1 to 4,000 Pa, specifically 1 to 3,000 Pa Reaction gas supply flow rate: 0.1 to 10 slm Reaction gas supply time: 1 to 120 seconds, specifically 1 to 60 seconds Other processing conditions are the same as the processing conditions in step 1.

By supplying the reaction gas, for example, a nitrogen (N)- and hydrogen (H)-containing gas to the wafer 200 under the above condition, at least a part of the Si-containing layer formed on the wafer 200 is nitrided (modified). As a result, a silicon nitride layer (SiN layer) is formed as a layer containing Si and N on the outermost surface of the wafer 200 as a base. When forming the SiN layer, impurities such as Cl and the like contained in the Si-containing layer constitute a gaseous substance containing at least Cl in the course of the modifying process of the Si-containing layer by the N- and H-containing gas, and are discharged from the process chamber 201. As a result, the SiN layer becomes a layer having fewer impurities such as Cl and the like than the Si-containing layer formed in step 1.

After the SiN layer is formed, the valves 243b and 243c are closed to stop the supply of the reaction gas into the process chamber 201. Then, the gas and the like remaining in the process chamber 201 are removed from the process chamber 201 by the same process procedure as in the purge in step 1 (purge).

As the reaction gas, it may be possible to use, for example, a nitriding gas (nitriding agent). As the nitriding gas, it may be possible to use, for example, the above-mentioned N- and H-containing gas. The N- and H-containing gas is both an N-containing gas and an H-containing gas. It is desirable that the N- and H-containing gas has an N—H bond.

As the reaction gas, it may be possible to use, for example, a hydrogen nitride-based gas such as an ammonia ($NH_3$) gas, a diazene ($N_2H_2$) gas, a hydrazine ($N_2H_4$) gas, an $N_3H_8$ gas or the like. One or more of these gases may be used as the reaction gas.

As the reaction gas, in addition to these, it may be possible to use, for example, a nitrogen (N)-, carbon (C)-, and hydrogen (H)-containing gas. As the N-, C- and H-containing gas, it may be possible to use, for example, an amine-based gas or an organic hydrazine-based gas. The N, C and H-containing gas is also an N-containing gas, a C-containing gas, an H-containing gas, and an N- and C-containing gas.

As the reaction gas, it may be possible to use, for example, an ethylamine-based gas such as a monoethylamine ($C_2H_5NH_2$, abbreviation: MEA) gas, a diethylamine (($C_2H_5)_2NH$, abbreviation: DEA) gas, a triethylamine (($C_2H_5)_3N$, abbreviation: TEA) gas or the like, a methylamine-based gas such as a monomethylamine ($CH_3NH_2$, abbreviation: MMA) gas, a dimethylamine (($CH_3)_2NH$, abbreviation: DMA) gas, a trimethylamine (($CH_3)_3N$, abbreviation: TMA) gas or the like, an organic hydrazine-based gas such as a monomethylhydrazine (($CH_3)HN_2H_2$, abbreviation: MMH) gas, a dimethylhydrazine (($CH_3)_2N_2H_2$, abbreviation: DMH) gas, a trimethylhydrazine (($CH_3)_2N_2(CH_3)H$, abbreviation: TMH) gas, and so forth. One or more of these gases may be used as the reaction gas.

[Performing a Cycle a Predetermined Number of Times]

By performing a cycle a predetermined number of times (m times where m is an integer of 1 or more), the cycle that includes performing the above-described steps 1 and 2 non-simultaneously, that is, without synchronization, a film having a predetermined thickness, for example, a SiN film having a predetermined thickness can be formed on the surface of the wafer 200 as a base. It is desirable that the above cycle is repeated multiple times. That is, it is desirable that the thickness of the SiN layer formed per cycle is set to be smaller than a desired film thickness and the aforementioned cycle is repeated multiple times until the thickness of a SiN film formed by laminating the SiN layers becomes equal to the desired film thickness. When the N-, C-, and H-containing gas is used as the reaction gas, for example, a silicon carbonitride layer (SiCN layer) may be formed as the second layer, or for example, a silicon carbonitride film (SiCN film) may be formed as the film on the surface of the wafer 200 by performing the above-described cycle a predetermined number of times.

When the film-forming process is performed, deposits including the SiN film are also formed on an interior of the process container, for example, an inner wall of the process container, that is, an inner wall of the reaction tube 203, an inner wall of the manifold 209, surfaces of the nozzles 249a to 249c, a surface of the boat 217, and the like. In particular, the deposit including the SiN film formed on the region 500 shown in FIG. 7, that is, in the nozzle 249a as the first supplier and its periphery inside the process container becomes Si-richer and thicker than the deposit including the SiN film formed on other regions (e.g., the second supplier and its periphery) inside the process container.

(After-Purge and Atmospheric Pressure Restoration)

After the process of forming the SiN film having the desired film thickness on the wafer 200 is completed, an inert gas as a purge gas is supplied from each of the nozzles 249a to 249c into the process chamber 201 and exhausted from the exhaust port 231a. As a result, the interior of the process chamber 201 is purged, and the gas, the reaction by-products and the like remaining in the process chamber 201 are removed from the interior of the process chamber 201 (after-purge). Thereafter, the atmosphere in the process chamber 201 is replaced with the inert gas (inert gas replacement), and the pressure in the process chamber 201 is restored to the atmospheric pressure (atmospheric pressure restoration).

(Boat Unloading)

Thereafter, the seal cap 219 is lowered by the boat elevator 115, and the lower end of the manifold 209 is opened. Then, the processed wafers 200 are unloaded from the lower end of the manifold 209 to the outside of the reaction tube 203 while being supported by the boat 217 (boat unloading). After unloading the boat, as shown in FIG. 5, the shutter 219s is moved and the lower end opening of the manifold 209 is sealed by the shutter 219s via the O-ring 220c (shutter closing).

(Wafer Cooling)

After unloading the boat, that is, after closing the shutter, the processed wafers 200 are cooled until it becomes a predetermined temperature at which they can be discharged, while being supported by the boat 217 (wafer cooling).

(Wafer Discharging)

After cooling the wafers, the processed wafers 200 cooled until it becomes the predetermined temperature at which they can be discharged are discharged from the boat 217 (wafer discharging).

(In-Furnace Adhesion Film Oxidizing Process)

In parallel with the wafer cooling and the wafer discharging, a process of oxidizing the film adhering to the furnace in the film-forming process, that is, the deposit including the SiN film formed inside the process container in the film-forming process, is performed. The oxidizing process of the SiN film formed inside the process container is performed in such a manner that the oxidation of the SiN film is not saturated, that is, in an unsaturated oxidizing manner.

That is, after the boat is unloaded, the shutter is closed. Then, in the state of FIG. 5, in parallel with the wafer cooling and the wafer discharging, an O-containing gas and an H-containing gas as the oxidizing gas are simultaneously supplied into the process container having a depressurized state (a state below the atmospheric pressure) from which the processed wafers 200 are unloaded. The interior of the process container is in a reduced pressure state and also in a heated state. As a result, one part of the SiN film formed inside the process container in the film-forming process can be oxidized into a SiO film, and the other part of the SiN film different from the one part of the SiN film can be maintained as it is without oxidizing the other part of the SiN film.

Specifically, after the shutter is closed, the valves 243f and 243e are opened to allow the O-containing gas and the H-containing gas to flow into the gas supply pipes 232f and 232e, respectively. The flow rates of the O-containing gas and the H-containing gas flowing through the gas supply pipes 232f and 232e are adjusted by the MFCs 241f and 241e, respectively. The O-containing gas and the H-containing gas are supplied into the process chamber 201 via the nozzles 249c and 249b. The O-containing gas and the H-containing gas are mixed and reacted in the process chamber 201, and then exhausted from the exhaust port 231a. At this time, a water ($H_2O$)-free oxidizing species containing oxygen such as atomic oxygen or the like generated by the reaction between the O-containing gas and the H-containing gas is supplied to the SiN film formed inside the process container (O-containing gas+H-containing gas supply). In this case, the valves 243g to 243i may be opened to supply an inert gas into the process chamber 201 via the nozzles 249a to 249c.

An example of a processing condition in this step is described as follows.

Processing temperature (temperature in process chamber 201): 400 to 800 degrees C., specifically 600 to 700 degrees C.

Processing pressure (pressure in process chamber 201): 1 to 2,000 Pa, specifically 1 to 1,000 Pa O-containing gas supply flow rate: 0.1 to 10 slm H-containing gas supply flow rate: 0.1 to 15 slm Inert gas supply flow rate (for each gas supply pipe): 0 to 10 slm Each gas supply time: 15 to 60 minutes It is desirable that the H-containing gas ratio (H-containing gas supply flow rate/(H-containing gas supply flow rate+O-containing gas supply flow rate)), that is, the concentration of the H-containing gas is 50 to 60%.

By supplying the O-containing gas and the H-containing gas to the SiN film formed inside the process container under the above condition, one part of the SiN film formed inside the process container can be oxidized into a SiO film by using strong oxidizing power of oxidizing species such as atomic oxygen or the like, and the other part of the SiN film different from the one part of the SiN film can be maintained as it is without oxidizing the other part of the SiN film. For example, one part of a surface side of the SiN film formed inside the process container can be oxidized into a SiO film, and the other part (the part opposite to the surface side) of the SiN film different from the one part of the surface side of the SiN film can be maintained as it is without oxidizing the other part of the SiN film.

The one part of the SiN film formed inside the process container is expanded by introducing O when it is changed into the SiO film by oxidation. Therefore, the SiO film obtained by oxidizing the one part of the SiN film formed inside the process container becomes thicker than the one part of the SiN film which is formed inside the process container before oxidation (the part of the SiN film to be oxidized). The thickness of the SiO film obtained by oxidizing the one part of the SiN film formed inside the process container may be increased to about 1.4 to 1.5 times of the thickness of the one part of the SiN film formed inside the process container before oxidation.

Thus, the total thickness of a laminated structure, that is, a laminated film (hereinafter also referred to as a SiO/SiN laminated film) including the SiO film obtained by oxidizing one part of the SiN film formed inside the process container and the SiN film formed inside the process container and maintained as it is without being subjected to oxidizing becomes larger than the thickness of the SiN film formed inside the process container before oxidation.

Further, the stress (film stress, internal stress or residual stress) of the SiN film formed inside the process container is a tensile stress, whereas the stress of the SiO film obtained by oxidizing one part of the SiN film formed inside the process container is a compressive stress. When the tensile stress is represented by "+" and the compressive stress is represented by "−", the stress of the SiN film formed inside the process container may be, for example, about +1.0 to +1.5 GPa, and the stress of the SiO film obtained by oxidizing one part of the SiN film formed inside the process container may be, for example, about −0.3 to −0.5 GPa.

Thus, the total stress of the laminated film, that is, the SiO/SiN laminated film including the SiO film obtained by oxidizing one part of the SiN film formed inside the process container and the SiN film formed inside the process container and maintained as it is before oxidation is smaller than the stress of the SiN film formed inside the process container before oxidation. This is because the tensile stress of the SiN film and the compressive stress of the SiO film in the SiO/SiN laminated film act to cancel each other. By adjusting the thickness of the SiN film or the SiO film in the SiO/SiN laminated film, it is possible to adjust the stress balance between the tensile stress of the SiN film and the compressive stress of the SiO film in the SiO/SiN laminated film and to cancel the respective stresses. That is, by adjusting the stress balance, it is possible to bring the total stress of the SiO/SiN laminated film close to zero and set the stress to zero. By reducing the stress of the film formed inside the process container in this way, it is possible to suppress generation of particles due to the film formed inside the process container.

In terms of the effect of suppressing particle generation caused by the film formed inside the process container, it is desirable to bring the total stress of the SiO/SiN laminated film close to zero. In that case, it takes time to perform the oxidizing process of the SiN film formed inside the process container. As in the process sequence B shown in FIG. 4, the oxidizing process time, that is, the in-furnace adhesion film oxidizing process time may exceed the total time of the wafer cooling time and the wafer discharging time. In the process sequence B shown in FIG. 4, there is generated a time during which only the in-furnace adhesion film oxidizing process is performed, that is, a waiting time during which the wafer cooling and the wafer discharging are not performed. In this case, the time during which the film-forming process cannot be performed, that is, the downtime of the substrate processing apparatus becomes long, which may affect the productivity of the film-forming process.

There is also a method of converting the entire SiN film into a SiO film by oxidizing the entire SiN film formed inside the process container, that is, by fully oxidizing the SiN film formed inside the process container. However, in that case, it takes more time to perform the oxidizing process of the SiN film formed inside the process container, and the oxidizing process time, that is, the in-furnace adhesion film oxidizing process may significantly exceed the total time of the wafer cooling time and the wafer discharging time. In this case, the time during which the film-forming process cannot be performed, that is, the downtime of the substrate processing apparatus becomes longer, which may affect the productivity of the film-forming process. When the SiN film formed inside the process container is fully oxidized to convert the entire SiN film into a SiO film, the stress of the SiO film thus converted is a compressive stress.

On the other hand, if the total stress of the SiO/SiN laminated film is not set to zero or a compressive stress but is set to a tensile stress smaller than the stress (tensile stress) of the SiN film formed inside the process container before the oxidation, the oxidizing process time for the SiN film formed inside the process container can be shortened, and as in the process sequence A shown in FIG. 4, the oxidizing process time for the SiN film formed inside the process container, that is, the in-furnace adhesion film oxidizing process can be made equal to or shorter than the total time of the wafer cooling time and the wafer discharging time. In this case, the time during which the film-forming process cannot be performed remains the same as in the case where the in-furnace adhesion film oxidizing process is not performed, and does not affect the productivity of the film-forming process. The present inventors have found that the effect of suppressing particle generation can be obtained even when the total stress of the SiO/SiN laminated film is not set to zero but is set to a tensile stress smaller than the stress (tensile stress) of the SiN film formed inside the process container before oxidation. That is, by setting the total stress of the SiO/SiN laminated film to the tensile stress smaller than the stress of the SiN film formed inside the process container before oxidation, it is possible to maintain the productivity of the film-forming process while obtaining the effect of suppressing particle generation. It is also possible to improve the productivity of the film-forming process by further shortening the in-furnace adhesion film oxidizing process time and consequently shortening the total time of the wafer cooling time and the wafer discharging time.

The present inventors have found that, by setting the ratio of the SiO film in the SiO/SiN laminated film to 75% or less, specifically 70% or less, that is, by setting the ratio of the SiN film in the SiO/SiN laminated film to 25% or more, specifically 30% or more, the total stress of the SiO/SiN laminated film can be set to a tensile stress smaller than the stress (tensile stress) of the SiN film formed inside the process container before oxidation, and the same effect as the above-described effect can be obtained. Further, the present inventors have found that, when the ratio of the SiO film in the SiO/SiN laminated film formed on the in-furnace adhesion film oxidizing process is set to exceed 75%, the total stress of the SiO/SiN laminated film becomes a compressive stress.

Further, the present inventors have found that, by setting the thickness of the part of the SiN film formed inside the process container and subjected to oxidizing to 65% or less, specifically 60% or less, that is, by setting the thickness of the part of the SiN film formed inside the process container and maintained as it is without being subjected to oxidizing to 35% or more, specifically 40% or more, the total stress of the SiO/SiN laminated film can be set to a tensile stress smaller than the stress (tensile stress) of the SiN film formed inside the process container before oxidation, and the same effect as the above-described effect can be obtained.

Further, the present inventors have found that, by setting the thickness of the part of the SiN film formed inside the process container and subjected to oxidizing to become smaller than the thickness of the part of the SiN film formed inside the process container and maintained as it is without being subjected to oxidizing, the total stress of the SiO/SiN laminated film can be easily allowed to become a tensile stress smaller than the stress (tensile stress) of the SiN film formed inside the process container before oxidation, and the same effect as the above-described effect can be surely obtained.

Figure 7:
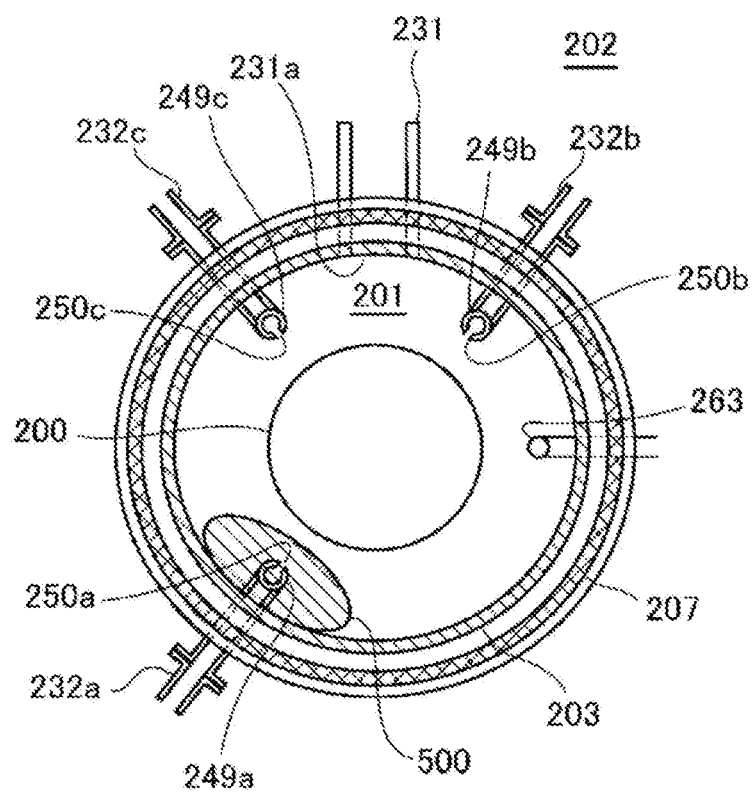
FIG. 7 is a schematic configuration diagram of a vertical process furnace of a substrate processing apparatus suitably used in embodiments of the present disclosure, in which a portion of a process furnace 202 where a film is heavily formed is illustrated in a cross-sectional view taken along line A-A in FIG. 1.

As described above, the SiN film formed on the region 500 shown in FIG. 7, that is, in the nozzle 249a as the first supplier and its periphery inside the process container becomes Si-richer and thicker than the SiN film formed on other regions (e.g., the second supplier and its periphery) inside the process container. As a result, a risk of particle generation due to the SiN film formed on the region 500 in the process container becomes higher than a risk of particle generation due to the SiN film formed on the portions other than the region 500 inside the process container.

On the other hand, in the embodiments, when the in-furnace adhesion film oxidizing process is performed, the H-containing gas is supplied toward the nozzle 249a from the nozzle 249b as the second supplier located at a position facing the nozzle 249a as the first supplier. More specifically, the O-containing gas is supplied from the nozzle 249c as the second supplier located at a position not facing the nozzle 249a as the first supplier, and the H-containing gas is supplied toward the nozzle 249a as the first supplier, that is, toward the region 500 from the nozzle 249b as the second supplier located at a position facing the nozzle 249a as the first supplier.

As a result, when performing the in-furnace adhesion film oxidizing process, an oxidization amount of the SiN film formed on the region 500 in the process container can be made larger than an oxidization amount of the SiN film formed on the portions other than the region 500 in the process container. That is, when performing the in-furnace adhesion film oxidizing process, the SiO film formed by oxidizing the SiN film formed on the region 500 in the process container can be made thicker than the SiO film formed by oxidizing the SiN film formed on the parts other than the region 500 in the process container. As a result, the stress of the Si-rich SiN film formed on the region 500 in the process container having a relatively high risk of particle generation can be appropriately controlled (relaxed) just like the stress of the SiN film formed on the parts other than the region 500 in the process container. In particular, it is possible to suppress the generation of particles due to the SiN film formed on the region 500 in the process container. In this case, by making the supply flow rate of the H-containing gas larger than the supply flow rate of the O-containing gas, the above-mentioned action can be further enhanced.

When performing the in-furnace adhesion film oxidizing process, it may be performed to pulse-exhaust (intermittently exhaust) the interior of the process container while continuously supplying the O-containing gas and the H-containing gas into the process container. That is, when performing the in-furnace adhesion film oxidizing process, the exhaust stop of the interior of the process container and the exhaust of the interior of the process container may be alternately performed a predetermined number of times (specifically repeated multiple times) while continuously supplying the O-containing gas and the H-containing gas into the process container.

Specifically, when performing the in-furnace adhesion film oxidizing process, as shown in FIG. 8, the APC valve 244, which is an exhaust valve may be opened and closed a predetermined number of times (n times where n is an integer of 1 or more) in a state in which the O-containing gas and the H-containing gas are continuously supplied into the process container. That is, when performing the in-furnace adhesion film oxidizing process, a cycle of alternately performing a step of supplying the O-containing gas and the H-containing gas into the process container with the APC valve 244 closed and a step of supplying the O-containing gas and the H-containing gas into the process container with the APC valve 244 opened may be performed a predetermined number of times (n times where n is an integer of 1 or more). That is, when performing the in-furnace adhesion film oxidizing process, a cycle of alternately performing a step of supplying the O-containing gas and the H-containing gas into the process container with the exhaust of the interior of the process container stopped and a step of supplying the O-containing gas and the H-containing gas into the process container with the process container exhausted may be performed a predetermined number of times (n times where n is an integer of 1 or more). FIG. 8 shows an example in which these cycles are repeated a plurality of times. When the APC valve 244 is opened, the exhaust pipe 231 is opened. When the APC valve 244 is closed, the exhaust pipe 231 is closed. In these cases, that is, when the APC valve 244 is opened and closed a predetermined number of times while continuously supplying the O-containing gas and the H-containing gas into the process container, it is desirable to maintain the interior of the process container in a depressurized state.

In this case, as shown in FIG. 8, it is desirable that the time for maintaining the APC valve 244 as the exhaust valve in the closed state is made longer than the time for maintaining the APC valve 244 in the opened state. That is, it is desirable that the time for maintaining the state in which the exhaust of the interior of the process container is stopped is made longer than the time for maintaining the state in which a stat of exhausting the interior of the process container is maintained.

In addition to continuously supplying the O-containing gas and the H-containing gas into the process container, the O-containing gas and the H-containing gas may be supplied intermittently. When the O-containing gas and the H-containing gas are intermittently supplied into the process container, it is desirable to overlap at least a part of the period in which the APC valve 244 is closed, that is, the period in which the exhaust of the interior of the process container is stopped, and at least a part of the period in which the O-containing gas and the H-containing gas are supplied into the process container.

As shown in FIGS. 2 and 7, the nozzles 249*c* and 249*b* as the second suppliers are both arranged in the vicinity of the exhaust port 231*a*. The O-containing gas and the H-containing gas supplied from the nozzles 249*c* and 249*b*, respectively, may be exhausted from the exhaust port 231*a* before reaching, for example, the portion inside the process container opposite to the exhaust port 231*a*. By performing the opening and closing of the APC valve 244 a predetermined number of times (n times where n is an integer of 1 or more) in a state in which the O-containing gas and the H-containing gas are continuously or intermittently supplied into the process container, the timing or frequency at which the APC valve 244 is closed can be increased, and the O-containing gas and the H-containing gas can be caused to sufficiently reach (go around or diffuse to), for example, the portion inside the process container opposite to the exhaust port 231*a*. Also, it makes it possible that the O-containing gas and the H-containing gas sufficiently spread (go around or diffuse) at a region 500 in the process container. This makes it possible to sufficiently perform an oxidizing process on the SiN film formed at, for example, the portion inside the process container opposite to the exhaust port 231*a*. Further, it is also possible to sufficiently perform an oxidizing process on the SiN film formed on the region 500 in the process container. That is, the SiN film formed inside the process container can be uniformly subjected to a necessary and sufficient oxidizing process. The positional relationship between the nozzles 249*c* and 249*b* and the exhaust port 231*a* is not limited to that shown in FIGS. 2 and 7. The same effect can be obtained even if the positional relationship is different from that shown in FIG. 2.

In this case, as shown in FIG. 8, by making the time for maintaining the closed state of the APC valve 244 as the exhaust valve longer than the time for maintaining the opened state of the APC valve 244, it is possible to prolong the period (hours) in which the APC valve 244 is closed. That is, by making the time for maintaining the state in which the exhaust of the interior of the process container is stopped longer than the time for maintaining the state in which the process container is exhausted, it is possible to prolong the period (time) in which the APC valve 244 is closed. As a result, the O-containing gas and the H-containing gas can be caused to more sufficiently reach, for example, the portion of the process container opposite to the exhaust port 231*a*, and the oxidizing process can be more sufficiently performed on the SiN film formed in, for example, the part of the process container opposite to the exhaust port 231*a*. Further, it is possible to more sufficiently perform the oxidizing process on the SiN film formed on the region 500 in the process container. As a result, the SiN film formed inside the process container can be more uniformly subjected to a necessary and sufficient oxidizing process. In this case, as shown in FIG. 8, the time for maintaining the state in which the APC valve 244 as the exhaust valve is fully closed (CLOSE state in FIG. 8) is specifically set to be longer than the time for maintaining the state in which the APC valve 244 is fully opened (OPEN state in FIG. 8). Thus, the above-mentioned effects can be more sufficiently obtained.

FIG. 8 shows an example where in the process of converting the state in which the APC valve 244 as the exhaust valve is closed (CLOSE state in FIG. 8) to the state in which the APC valve 244 is opened (OPEN state in FIG. 8), there is provided a period during which the process container is slightly exhausted by slightly opening the APC valve 244 while keeping the APC valve 244 in a substantially closed state. That is, FIG. 8 shows an example where in the process of converting the state in which the evacuation of the process container is stopped to the state in which the process container is exhausted, there is provided a period during which the process container is slightly exhausted while keeping the evacuation of the process container in a substantially stopped state. The reason for providing the period during which the process container is slightly exhausted while keeping the APC valve 244 in a substantially closed state, that is, while keeping the exhaust of the interior of the process container in a substantially stopped state, is to suppress the overshoot of the pressure rise in the process container. This makes it possible to suppress a decrease in the oxidization efficiency due to an excessive increase in the pressure in the process container. In the present disclosure, the case where the process container is slightly exhausted while keeping the APC valve 244 in a substantially closed state, that is, while keeping the exhaust of the interior of the process container in a substantially stopped state, will also be referred to as "a state in which the APC valve 244 is closed", that is, "a state in which the exhaust valve is closed". Further, in the present disclosure, the case where the process container is slightly exhausted while keeping the APC valve 244 in a substantially closed state, that is, while keeping the exhaust of the process container in a substantially stopped state will also be referred to as "a state in which the evacuation of the process container is stopped".

As shown in FIG. 8, by making the time for maintaining the closed state of the APC valve 244 as the exhaust valve longer than the time for maintaining the opened state of the APC valve 244, it is possible to make the time for raising the pressure in the process container longer than the time for lowering the pressure in the process container. That is, it can be said that by making the time for raising the pressure in the process container longer than the time for lowering the pressure in the process container, it is possible to obtain the above-mentioned effects.

An example of a processing condition in the in-furnace adhesion film oxidizing process shown in FIG. 8 is described as follows.

Processing temperature (temperature in process chamber 201): 400 to 800 degrees C., specifically 600 to 700 degrees C.

Processing pressure (pressure in process chamber 201): 1 to 2,000 Pa, specifically 1 to 1,000 Pa O-containing gas supply flow rate: 0.1 to 10 slm
H-containing gas supply flow rate: 0.1 to 15 slm
Inert gas supply flow rate (for each gas supply pipe): 0 to 10 slm
Exhaust valve closing time: 2 to 60 seconds, specifically 10 to 50 seconds, more specifically 20 to 40 seconds
Exhaust valve opening time: 0.5 to 50 seconds, specifically 2 to 30 seconds, more specifically 5 to 10 seconds
Number of opening/closing times of exhaust valve: 1 to 100 times, specifically 2 to 80 times, more specifically 10 to 50 times
It is desirable that the H-containing gas ratio (H-containing gas supply flow rate/(H-containing gas supply flow rate+O-containing gas supply flow rate)), that is, the concentration of the H-containing gas is specifically 50 to 60%.

As the O-containing gas, it may be possible to use, for example, an oxygen ($O_2$) gas, an ozone ($O_3$) gas, a water vapor ($H_2O$ gas), a hydrogen peroxide ($H_2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas and the like. One or more of them may be used as the O-containing gas.

As the H-containing gas, it may be possible to use, for example, a hydrogen ($H_2$) gas or a deuterium ($^2H_2$) gas. The $^2H_2$ gas is also referred to as a $D_2$ gas. One or more of them may be used as the H-containing gas. In this step, the supply of the H-containing gas may not be carried out, and the O-containing gas alone may be supplied as the oxidizing gas.

Further, in this step, at least one selected from the group of the O-containing gas and the H-containing gas may be plasma-excited and supplied. For example, a plasma-excited $O_2$ gas and a non-plasma-excited $H_2$ gas may be supplied. A non-plasma-excited $O_2$ gas and a plasma-excited $H_2$ gas may be supplied. A plasma-excited $O_2$ gas and a plasma-excited $H_2$ gas may be supplied. Further, the supply of the H-containing gas may not be carried out, and the plasma-excited $O_2$ gas alone may be supplied. As a result, it is possible to further shorten the oxidizing process time.

After completing the in-furnace adhesion film oxidizing process, the valves 243f and 243e are closed to stop the supply of the O-containing gas and the H-containing gas into the process chamber 201. Thereafter, an inert gas as a purge gas is supplied into the process chamber 201 from each of the nozzles 249a to 249c, and is exhausted from the exhaust port 231a. As a result, the interior of the process chamber 201 is purged, and the gas, reaction by-products and the like remaining in the process chamber 201 are removed from the interior of the process chamber 201 (purge). Thereafter, the atmosphere in the process chamber 201 is replaced with the inert gas (inert gas replacement), and the pressure in the process chamber 201 is restored to the atmospheric pressure (atmospheric pressure restoration).

By these series of processes, in the case of repeating a set a plurality of times, the set that includes performing the above-described (a), (b), (c), and (d), the first set (first batch process), that is, the $1^{st}$ RUN in FIG. 4 is ended. Then, this set (batch process) is performed a plurality of times. During that time, it is possible to appropriately suppress the generation of particles due to the film formed inside the process container.

As described above, the in-furnace adhesion film oxidizing process is performed in the shutter closed state. That is, the in-furnace adhesion film oxidizing process is performed without loading (accommodating) the processed boat 217 and wafers 200 (product wafers and dummy wafers) into the process container. As a result, the above-described oxidizing process is not performed on the SiN film formed on each of the surfaces of the boat 217 and wafers 200 (product wafers and dummy wafers) after the process. The SiN film formed on each of the surfaces of the boat 217 and wafers 200 (product wafers and dummy wafers) is not subjected to the above-described oxidizing process but is maintained as it is, that is, in the state of the SiN film.

As a result, during and after the second set (second batch process), that is, during and after the $2^{nd}$ RUN in FIG. 4, the film-forming process can be performed in a state in which the wafers 200, that is, the product wafers to be processed next and the dummy wafers on which the SiN film is formed, are supported by the boat 217 having the SiN film formed on the surface thereof.

That is, during and after the second set (second batch process), the wafers 200 come into contact with the boat 217 via the SiN film formed on the surface of the boat 217. Specifically, the boat 217 and the product wafers to be processed next come into contact with each other via the SiN film formed on the surface of the boat 217. Further, the boat 217 and the dummy wafers come into contact with each other via the SiN film formed on each of the surfaces thereof. The SiN film formed on the surface of the boat 217 and the front surfaces (back surfaces) of the product wafers are made of materials having similar coefficients of thermal expansion. Therefore, even when each of the SiN film and the product wafers is heated and thermally expanded during the film-forming process, it is possible to suppress the generation of particles from those contact points because the degrees of thermal expansion thereof are close to each other. Further, the SiN film formed on the surface of the boat 217 and the SiN film formed on each of the surfaces of the dummy wafers are made of the same material and have the same coefficient of thermal expansion. Therefore, even when each of the SiN films is heated and thermally expanded during the film-forming process, it is possible to suppress the generation of particles from those contact points because the SiN films are thermally expanded in the same manner.

(3) Effect of the Present Embodiment

According to the present embodiment, one or more of the following effects may be obtained.

In the in-furnace adhesion film oxidizing process, the O-containing gas and the H-containing gas are supplied into the process container, and at that time, the H-containing gas is supplied toward the first supplier. Therefore, it is possible to sufficiently oxidize the Si-rich SiN film formed on the first supplier and its periphery (region 500) having a relatively high risk of particle generation. That is, the oxidization amount of the SiN film formed on the region having a relatively high risk of particle generation can be made larger than the oxidization amount of the SiN film formed on other portions. In other words, the SiO film formed by oxidizing the SiN film formed on the region having a relatively high risk of particle generation can be made thicker than the SiO film formed by oxidizing the SiN film formed on other portions. As a result, the stress of the SiN film formed on the region having a relatively high risk of particle generation can be appropriately controlled (relaxed) just like the stress of the SiN film formed on the portions other than the region. In particular, it is possible to sufficiently suppress the generation of particles due to the SiN film formed on the region.

In this case, by supplying the H-containing gas toward the first supplier from the position facing the first supplier, it is possible to efficiently oxidize the SiN film formed on the region having a relatively high risk of particle generation.

Further, in this case, by supplying the H-containing gas and the O-containing gas from any of the plurality of second suppliers, and supplying the H-containing gas toward the first supplier from the second supplier facing the first supplier, it is possible to efficiently oxidize the SiN film formed on the region having a relatively high risk of particle generation. In addition, a supplier for supplying the H-containing gas and the O-containing gas does not have to be separately provided, and may be shared with the second supplier for supplying the reaction gas. Therefore, it is possible to reduce the apparatus cost.

In the in-furnace adhesion film oxidizing process, by performing the pulse exhaust of the process container, that is, performing the opening and closing of the exhaust valve a predetermined number of times, specifically a plurality of times, in a state in which the O-containing gas and the H-containing gas are continuously or intermittently supplied into the process container, it is possible to cause the O-containing gas and the H-containing gas to sufficiently reach, for example, the part of the process container opposite to the exhaust port. Thus, it is possible to sufficiently perform the oxidizing process on the SiN film formed on, for example, the part of the process container opposite to the exhaust port. That is, it is possible to uniformly perform the oxidizing process on the SiN film formed inside the process container. As a result, it is possible to uniformly perform a necessary and sufficient oxidizing process on the SiN film formed inside the process container. In this case, it is desirable that the exhaust stop of the interior of the process container and the interior of the interior of the process container are alternately performed a predetermined number of times, specifically a plurality of times, while continuously or intermittently supplying the O-containing gas and the H-containing gas into the process container.

In this case, the step of supplying the O-containing gas and the H-containing gas into the process container while stopping the exhaust of the interior of the process container and the step of supplying the O-containing gas and the H-containing gas into the process container while exhausting the interior of the process container may be alternately performed a predetermined number of times, specifically a plurality of times. Further, the step of supplying the O-containing gas and the H-containing gas into the process container while closing the exhaust valve and the step of supplying the O-containing gas and the H-containing gas into the process container while opening the exhaust valve may be alternately performed a predetermined number of times, specifically a plurality of times. In these cases as well, the same effects as the above-mentioned effects may be obtained.

Further, in this case, by making the time for maintaining the state in which the exhaust of the interior of the process container is stopped longer than the time for maintaining the state in which the exhaust of the interior of the process container is maintained, that is, by making the time for keeping the exhaust valve in a closed state longer than the time for keeping the exhaust valve in an opened state, it is possible to further enhance the above-mentioned effects. That is, it is possible to cause the O-containing gas and the H-containing gas to sufficiently reach, for example, the part of the process container opposite to the exhaust port, and it is possible to sufficiently perform the oxidizing process on the SiN film formed on, for example, the part of the process container opposite to the exhaust port. As a result, it is possible to uniformly perform a necessary and sufficient oxidizing process on the SiN film formed inside the process container.

In the in-furnace adhesion film oxidizing process, one part of the SiN film formed inside the process container is oxidized into a SiO film, and the other part of the SiN film different from the one part of the SiN film is maintained as it is without oxidizing the other part of the SiN film. Therefore, the stress balance of the film formed inside the process container can be adjusted, and the stress of the film formed inside the process container can be made smaller than the stress of the SiN film formed inside the process container before oxidation. As a result, it is possible to appropriately suppress the generation of particles caused by the film formed inside the process container, prolong the cleaning cycle, and improve the productivity of the film-forming process.

In the in-furnace adhesion film oxidizing process, one part of the SiN film formed inside the process container is oxidized into a SiO film, and the other part of the SiN film different from the one part of the SiN film is maintained as it is without oxidizing the other part of the SiN film. Therefore, it is possible to shorten the oxidizing time, and maintain or improve the productivity.

In the in-furnace adhesion film oxidizing process, one part of the SiN film formed inside the process container is oxidized into a SiO film, and the other part of the SiN film different from the one part of the SiN film is maintained as it is without oxidizing the other part of the SiN film. Therefore, the cumulative film thickness in the process container can be suppressed to become thinner than a case where the SiO film is deposited on the surface of the SiN film formed inside the process container, and the thickness of the SiN film itself formed inside the process container can be made thin. As a result, it is possible to reduce the risk of particle generation in the process container due to the increase in the cumulative film thickness and to reduce the thickness of the SiN film. If the SiO film is deposited on the surface of the SiN film formed inside the process container, the thickness of the SiN film itself formed inside the process container cannot be made thin, and is maintained as it is.

In the in-furnace adhesion film oxidizing process, one part of the SiN film formed inside the process container is oxidized into a SiO film, and the other part of the SiN film different from the one part of the SiN film is maintained as it is without oxidizing the other part of the SiN film. Therefore, as compared with the case where the SiO film is deposited on the surface of the SiN film formed inside the process container, it is possible to reduce contamination at the interface between the SiO film and the SiN film, stabilize an interface, and suppress film peeling at the interface. If the SiO film is deposited on the surface of the SiN film formed inside the process container, it is considered that the interface between the SiO film and the SiN film is contaminated and the film peeling is likely to occur. It is also considered that the gas phase reaction at the time of depositing the SiO film may cause a risk of particle generation.

By adjusting the thickness of the SiN film or the SiO film in the SiO/SiN laminated film which is a laminated film of the SiO film obtained by oxidizing one part of the SiN film formed inside the process container and the SiN film formed inside the process container and maintained without being oxidized, it is possible to adjust the stress balance between the tensile stress of the SiN film and the compressive stress of the SiO film in the SiO/SiN laminated film. As a result, the respective stresses can be canceled out, and the total stress of the SiO/SiN laminated film can be brought close to zero. Furthermore, the total stress can be made zero. This makes it possible to appropriately suppress the generation of particles caused by the film formed inside the process container.

By allowing the total stress of the SiO/SiN laminated film to become a tensile stress which is smaller than the stress (tensile stress) of the SiN film formed inside the process container before oxidation, it is possible to shorten the process time, and maintain or improve the productivity of the film-forming process while achieving the effect of suppressing the generation of particles.

By setting the ratio of the SiO film in the SiO/SiN laminated film to 75% or less, specifically 70% or less, it is possible to allow the total stress of the SiO/SiN laminated film to become a tensile stress which is smaller than the stress (tensile stress) of the SiN film formed inside the process container before oxidation, and it is possible to maintain or improve the productivity of the film forming process while achieving the effect of suppressing the generation of particles.

By performing the in-furnace adhesion film oxidizing process without accommodating (loading) the processed boat 217 into the process container, the SiN film formed on the surface of the boat 217 can be maintained as it is without being subjected to oxidizing. As a result, during and after the second set (second batch process), the film-forming process can be performed while the wafers 200 to be processed next are supported by the boat 217 having the surface on which the SiN film is formed. That is, during and after the second set (second batch process), the wafers 200 make contact with the boat 217 via the SiN film formed on the surface of the boat 217. This makes it possible to suppress the generation of particles from the contact points between the wafers 200 and the boat 217, as compared with the case where the SiN film formed on the surface of the boat 217 is oxidized.

When the in-furnace adhesion film oxidizing process is performed with the processed boat 217 accommodated (loaded) into the process container, at least the surface of the SiN film formed on the surface of the boat 217 is oxidized and the outermost surface of the boat is formed with a SiO film. In this case, during and after the second set (second batch process), the wafers 200 make contact with the boat 217 via the SiO film formed on the outermost surface of the boat 217. In this case, the SiO film formed on the outermost surface of the boat 217 and the front surfaces (back surfaces) of the wafers 200 to be processed next are made of materials having significantly different thermal expansion coefficients. As a result, when the SiO film and the front surfaces (back surfaces) of the wafers 200 are heated and thermally expanded during the film-forming process, the friction at the contact points thereof increases due to the difference in thermal expansion of the materials, and particles may be generated from the contact points.

By performing the in-furnace adhesion film oxidizing process without accommodating (loading) the processed boat 217 and the processed wafers 200 (product wafers and dummy wafer) into the process container, the SiN film formed on the surfaces of the boat 217 and the wafers 200 (product wafers and dummy wafers) can be maintained as it is without oxidizing the SiN film. As a result, during and after the second set (second batch process), the film-forming process can be performed while the product wafers to be processed next and the dummy wafers having the SiN film formed on the surface thereof are supported by the boat 217 having the SiN film formed on the surface thereof. That is, during and after the second set (second batch process) and thereafter, the boat 217 and the product wafers to be processed next come into contact with each other via the SiN film formed on the surface of the boat 217, and the boat 217 and the dummy wafers come into contact with each other via the SiN film formed on each of the surfaces thereof. This makes it possible to suppress the generation of particles from the contact points between the wafers 200 and the boat 217.

When the in-furnace adhesion film oxidizing process is performed with the processed boat 217 accommodated (loaded) into the process container, at least the surface of the SiN film formed on the surface of the boat 217 is oxidized and the outermost surface of the boat becomes a SiO film. In this case, during and after the second set (second batch process), the wafers 200 (the product wafers to be processed next and the dummy wafers having the SiN films formed on the surfaces thereof) make contact with the boat 217 via the SiO film formed on the outermost surface of the boat 217. In this case, the SiO film formed on the outermost surface of the boat 217 and the front surfaces (back surfaces) of the wafers 200 (the product wafers to be processed next and the dummy wafers having the SiN films formed on the surfaces thereof) are made of materials having significantly different thermal expansion coefficients. As a result, when the SiO film and the front surfaces (back surfaces) of the wafers 200 are heated and thermally expanded during the film-forming process, the friction at the contact points thereof increases due to the difference in thermal expansion of the materials, and particles may be generated from the contact points.

Further, by performing the in-furnace adhesion film oxidizing process without accommodating (loading) the processed boat 217 into the process container, it is possible to eliminate the boat loading time and the boat unloading time for the in-furnace adhesion film oxidizing process. Accordingly, it is possible to shorten the time during which the film-forming process cannot be performed, and it is possible to improve the productivity of the film-forming process.

By performing the in-furnace adhesion film oxidizing process in parallel with the wafer cooling, it is not necessary to provide a time just for performing the in-furnace adhesion film oxidizing process separately from the wafer cooling. This makes it possible to maintain or improve the productivity of the film-forming process. Depending on the conditions of the in-furnace adhesion film oxidizing process, the in-furnace adhesion film oxidizing may be performed in parallel with the wafer cooling and may be completed before the wafer discharging is started.

By performing the in-furnace adhesion film oxidizing process in parallel with the wafer cooling and the wafer discharging, it is not necessary to provide a time just for performing the in-furnace adhesion film oxidizing process separately from the wafer cooling and the wafer discharging. This makes it possible to maintain or improve the productivity of the film-forming process. Depending on the conditions of the in-furnace adhesion film oxidizing process, the in-furnace adhesion film oxidizing may be performed in parallel with the wafer cooling and the wafer discharging, and may be completed during and the wafer discharging.

The in-furnace adhesion film oxidizing process is performed every batch (every RUN), that is, each time when the batch process is performed once. Therefore, as compared with a case where the in-furnace adhesion film oxidizing process is performed each time the batch process is performed a plurality of times, it is possible to oxidize a part of the SiN film while the SiN film formed inside the process container is kept thin. As a result, the oxidizing process for the SiN film formed inside the process container can be performed every time in the region where the oxidizing rate can be increased. This makes it possible to shorten the oxidizing process time. On the other hand, if the in-furnace adhesion film oxidizing process is performed each time the batch process is performed a plurality of times, it is possible to oxidize a part of the SiN film while the SiN film formed inside the process container is kept thick. In this case, it becomes necessary to perform the oxidizing process in a region where the oxidizing rate is low, and the oxidizing process time may become long. In the case where the in-furnace adhesion film oxidizing process is performed every batch, as compared with the case where the in-furnace adhesion film oxidizing process is performed each time the batch process is performed a plurality of times, it is possible to increase the ratio of the SiO film in the cumulative film formed inside the process container and further reduce the stress of the cumulative film. That is, by performing the in-furnace adhesion film oxidizing process every batch, it is possible to achieve a particle generation suppressing effect and maintain or improve the productivity of the film-forming process while further enhancing the effect.

(4) Modifications

The process sequence according to the present embodiment may be changed as in the modifications described below. These modifications can be combined arbitrarily. Unless otherwise specified, the process procedure and the process condition in each step of each modification may be the same as the process procedure and the process condition in each step of the above-described process sequence.

(Modification 1)

In step 2 of the film-forming process, the N- and H-containing gas as the reaction gas may be plasma-excited, that is, activated into a plasma state and supplied to the wafer 200 in the process chamber 201, that is, the Si-containing layer formed on the wafer 200. That is, in the film-forming process, the respective gases may be supplied as in the below-denoted gas supply sequence to form a SiN film on the wafer 200.

(precursor gas→plasma-excited reaction gas)×n

Figure 6:
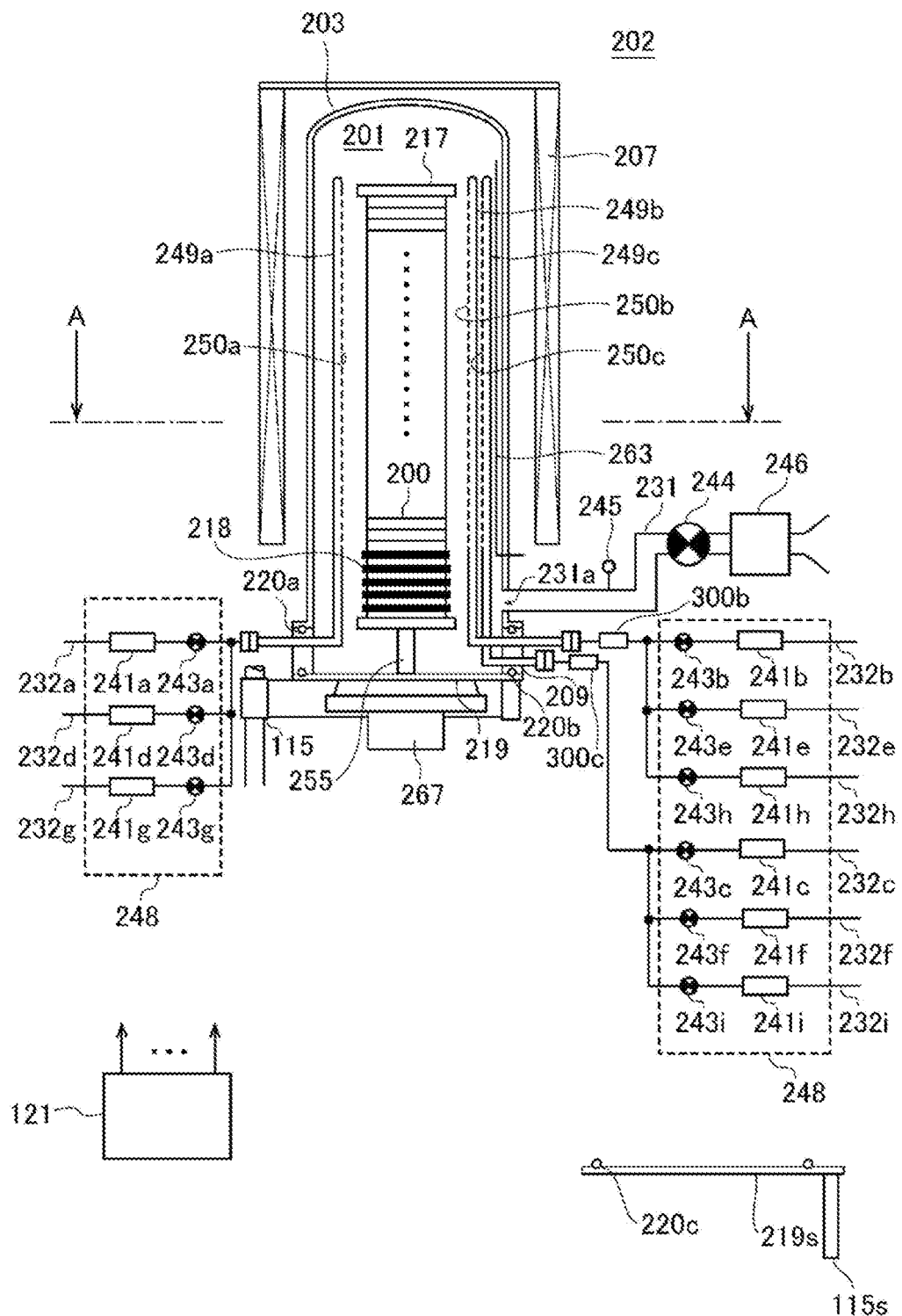
FIG. 6 is a schematic configuration diagram of a vertical process furnace of a substrate processing apparatus suitably used in a modification 1 of the present disclosure, in which a portion of a process furnace 202 is illustrated in a vertical cross-sectional view.

In this case, in step 2 of the film-forming process, for example, as shown in FIG. 6, the N- and H-containing gases as the reaction gases supplied into the gas supply pipes 232b and 232c may be plasma-excited by the remote plasma units 300b and 300c as the plasma excitation parts (plasma generators) respectively installed at the gas supply pipes 232b and 232c on the downstream side of the valves 243b and 243c, and may be supplied into the process chamber 201. In FIG. 6, the same parts as those shown in FIG. 1 are designated by the same reference numerals, and the description of the configurations thereof will be omitted.

According to this modification, the same effects as those of the above-described embodiment may be obtained. Further, according to this modification, it is possible to further reduce the temperature of the film-forming process as compared with the case where the film-forming process is performed in a non-plasma atmosphere as in the above-described embodiment. Even when the film-forming process is performed at a lower temperature using plasma in this way, the same effect as that of the above-described embodiment can be obtained.

(Modification 2)

When performing the in-furnace adhesion film oxidizing process, at least one selected from the group of the O-containing gas and the H-containing gas may be plasma-excited, that is, activated into a plasma state, and may be supplied into the process chamber 201.

In this case, in the in-furnace adhesion film oxidizing process, for example, as shown in FIG. 6, at least one selected from the group of the O-containing gas and the H-containing gas supplied into the gas supply pipes 232b and 232c from the gas supply pipes 232e and 232f may be plasma-excited by the remote plasma units 300b and 300c respectively installed at the gas supply pipes 232b and 232c on the downstream side of the valves 243b and 243c, and may be supplied into the process chamber 201. In FIG. 6, the same parts as those shown in FIG. 1 are designated by the same reference numerals, and the description of the configurations thereof will be omitted.

In the in-furnace adhesion film oxidizing process, the O-containing gas may be plasma-excited without plasma-exciting the H-containing gas. Further, the H-containing gas may be plasma-excited without plasma-exciting the O-containing gas. In addition, both the O-containing gas and the H-containing gas may be plasma-excited.

According to this modification, the same effects as those of the above-described embodiment may be obtained. Further, according to this modification, as compared with the case where the in-furnace adhesion film oxidizing process is performed in a non-plasma atmosphere as in the above-described embodiment, it is possible to further reduce the temperature of the in-furnace adhesion film oxidizing process. Even when the in-furnace adhesion film oxidizing process is performed at a lower temperature using plasma in this way, the same effect as that the above-described embodiment can be obtained. In addition, since the temperature of the in-furnace adhesion film oxidizing process can be reduced, the process temperatures of the film-forming process and the in-furnace adhesion film oxidizing process can be made equal to each other, and the time for changing the temperature in the process container can be eliminated. This makes it possible to further improve the productivity of the film-forming process. In particular, when the H-containing gas is plasma-excited and supplied, it is possible to desorb Cl contained in the SiN film adhering to the interior of the process container, and to further reduce the stress of the film adhering to the interior of the process container.

(Modification 3)

The in-furnace adhesion film oxidizing process may be performed not only in parallel with the wafer cooling and wafer discharging but also in parallel with the wafer charging for the wafers 200 to be processed next. That is, the in-furnace adhesion film oxidizing process may be performed in parallel with the wafer cooling, the wafer discharging and the wafer charging for the wafers 200 to be processed next.

According to this modification, the same effects as those of the above-described embodiment may be obtained. Further, according to this modification, the amount of oxidizing of the deposit including the SiN film formed inside the process container can be further increased, and the stress of the film formed inside the process container can be further reduced. This makes it possible to further suppress the generation of particles caused by the film formed inside the process container.

(Modification 4)

In the film-forming process, as the nitride film, a SiN film containing at least one selected from the group of C, O, and B may be formed in addition to the SiN film. That is, in the film-forming process, a SiN film, a SiCN film, a SiON film, a SiOCN film, a SiBN film, a SiBCN film, a SiBOCN film, a SiBON film, or the like may be formed as the nitride film. When forming these films, in the film-forming process, at least one selected from the group of a C-containing gas, an O-containing gas and a B-containing gas may be further supplied from the film-forming gas supply system.

Further, in the film-forming process, in addition to the silicon-based nitride film (silicon-containing nitride film or silicon nitride film), a germanium-based nitride film (germanium-containing nitride film or germanium nitride film) may be formed as the nitride film. As the germanium nitride film (GeN film), for example, GeN films containing at least one selected from the group of C, O, and B may be formed in addition to the GeN film. When forming these films, in the film-forming process, a Ge-containing gas may be used instead of the Si-containing gas, and at least one selected from the group of a C-containing gas, an O-containing gas, and a B-containing gas may be supplied from the film-forming gas supply system.

Further, in the film-forming process, in addition to the silicon-based nitride film (silicon-containing nitride film or silicon nitride film), a metal-based nitride film (metal-containing nitride film or metal nitride film) may be formed as the nitride film. Examples of the metal nitride film may include an aluminum nitride film (AlN film), a titanium nitride film (TiN film), a zirconium nitride film (ZrN film), a hafnium nitride film (HfN film), a tantalum nitride film (TaN film), a tungsten nitride film (WN film), a molybdenum nitride film (MoN film), and the like. When forming these films, in the film-forming process, instead of the Si-containing gas, at least one selected from the group of an Al-containing gas, a Ti-containing gas, a Zr-containing gas, a Hf-containing gas, a Ta-containing gas, a W-containing gas, and a Mo-containing gas may be supplied from the film-forming gas supply system.

As described above, in the film-forming process, a film containing at least one selected from the group of a semiconductor element and a metal element, and nitrogen may be formed as the nitride film.

In these cases, the film-forming process may be performed in a non-plasma atmosphere using the substrate processing apparatus shown in FIG. 1, or may be performed with plasma using the substrate processing apparatus shown in FIG. 6.

According to this modification, the same effects as those of the above-described embodiment may be obtained.

Other Embodiments of the Present Disclosure

The embodiment of the present disclosure has been specifically described above. However, the present disclosure is not limited to the above-described embodiment, and various modifications can be made without departing from the gist thereof.

For example, a process of cleaning the interior of the process container may be performed after repeating, a plurality of times, the set in which the above-described (a), (b), (c), and (d) are performed in the named order.

That is, by repeating, a plurality of times, the set in which the above-described (a), (b), (c), and (d) are performed in the named order, a SiO/SiN laminated film is accumulated inside the process container. In this case, the interior of the process container may be cleaned before the SiO/SiN laminated film accumulated inside the process container has a thickness exceeding a critical film thickness and undergoes cracking or peeling.

When cleaning the interior of the process container, a cleaning gas is supplied from a cleaning gas supply system into the process container without accommodating the wafers 200 in the process container and is exhausted from the exhaust pipe 231. At this time, the cleaning gas may be supplied into the process container in a state in which the boat 217 having a SiN film formed on the surface thereof is accommodated in the process container. Further, at this time, the cleaning gas may be supplied into the process container in a state in which the dummy wafer having a SiN film formed on the surface thereof is accommodated in the process container.

Process conditions in the cleaning process are exemplified as follows.

Process temperature (temperature inside process chamber 201): 200 to 500 degrees C.
Process pressure (pressure inside process chamber 201): 1,330 to 26,600 Pa
Cleaning gas supply flow rate: 0.5 to 5 slm
Inert gas supply flow rate: 1 to 20 slm As the cleaning gas, it may be possible to use, for example, a fluorine (F)-containing gas such as a fluorine ($F_2$) gas, a chlorine trifluoride ($ClF_3$) gas, a chlorine monofluoride (ClF) gas, a nitrogen trifluoride ($NF_3$) gas, a hydrogen fluoride (HF) gas or the like. As the cleaning gas, one or more of them may be used.

By the cleaning process, the state of adhesion of the film to the interior of the process container can be reset before the effect of the above-described embodiment disappears. Then, the effect of the above-described embodiment can be continuously obtained again. According to the above-described embodiment, it is possible to significantly increase the cumulative thickness until the film accumulated inside the process container has a thickness exceeding a critical film thickness and undergoes cracking or peeling. This makes it possible to significantly prolong the cycle of performing the cleaning process described herein and to greatly improve the total productivity of the film-forming process.

It is desirable that the recipes used for the respective processes are prepared separately according to the process contents and are stored in the memory device 121c via an electric communication line or an external memory device 123. When starting each process, it is desirable that the CPU 121a properly selects an appropriate recipe from a plurality of recipes stored in the memory device 121c according to the process contents. This makes it possible to form films of various film types, composition ratios, film qualities and film thicknesses with high reproducibility in one substrate processing apparatus. Moreover, due to these processes, the in-furnace adhesion film oxidizing process can be appropriately performed on the films of various film types, composition ratios, film qualities and film thicknesses formed inside the process container. In addition, the burden on an operator can be reduced, and each process can be quickly started while avoiding operation errors.

The above-described recipes are not limited to the newly-prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiments, there has been described the example in which the film is formed using the batch type substrate processing apparatus for processing a plurality of substrates at a time. The present disclosure is not limited to the above-described embodiments, but may be suitably applied to, for example, a case where a film is formed using a single-wafer type substrate processing apparatus for processing one or several substrates at a time.

Furthermore, in the above-described embodiments, there has been described the example in which the film is formed using the substrate processing apparatus having a hot wall type process furnace. The present disclosure is not limited to the above-described embodiments, but may also be suitably applied to a case where a film is formed using a substrate processing apparatus having a cold wall type process furnace.

Even in the case of using these substrate processing apparatuses, film formation may be performed under the same process procedures and process conditions as those in the above-described embodiments and modifications, and the same effects as those of the above-described embodiments and modifications may be obtained.

The above-described embodiments and modifications may be used in combination as appropriate. The process procedures and process conditions at this time may be the same as, for example, the process procedures and process conditions of the above-described embodiments.

According to the present disclosure in some embodiments, it is possible to prolong the cleaning cycle and improve the productivity of a film-forming process by properly suppressing the generation of particles due to a film formed inside a process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   (a) loading a substrate into a process container;
   (b) performing a process of forming a first nitride film on the substrate in the process container by alternately or simultaneously performing, a predetermined number of times:
      supplying a precursor gas from a first supplier to the substrate; and
      supplying a nitriding gas from a second supplier to the substrate;
   (c) unloading the processed substrate from an interior of the process container; and
   (d) oxidizing a part of a second nitride film, which is formed inside the process container in (b), into an oxide film so as to have a laminated structure of nitride and oxide in a state in which the processed substrate is unloaded from the interior of the process container,
   wherein in (d), an oxygen-containing gas and a hydrogen-containing gas are supplied into the process container and at that time, the hydrogen-containing gas is supplied toward the first supplier.

2. The method of claim 1, wherein in (d), the hydrogen-containing gas is supplied from a position facing the first supplier toward the first supplier.

3. The method of claim 1, wherein in (d), an oxidization amount of a third nitride film, which is formed on the first supplier and a periphery of the first supplier inside the process container, is made larger than an oxidization amount of a fourth nitride film, which is formed on other parts inside the process container.

4. The method of claim 1, wherein in (d), an oxide film, which is formed by oxidizing a third nitride film formed on the first supplier and a periphery of the first supplier inside the process container, is made thicker than an oxide film formed by oxidizing a fourth nitride film, which is formed on other parts inside the process container.

5. The method of claim 1, wherein in (b), a third nitride film, which is formed on the first supplier and a periphery of the first supplier inside the process container, is thicker than a fourth nitride film, which is formed on other parts inside the process container.

6. The method of claim 1, wherein the second supplier is installed in a plural number, and
   wherein in (d), the oxygen-containing gas and the hydrogen-containing gas are supplied from any of the plurality of second suppliers.

7. The method of claim 6, wherein one of the plurality of second suppliers faces the first supplier, and
   wherein in (d), the hydrogen-containing gas is supplied from the second supplier, which faces the first supplier, toward the first supplier.

8. The method of claim 1, wherein (d) includes alternately performing, a predetermined number of times, stopping an exhaust of the interior of the process container and exhausting the interior of the process container in a state in which the oxygen-containing gas and the hydrogen-containing gas are continuously or intermittently supplied into the process container.

9. The method of claim 1, wherein (d) includes alternately performing:
   supplying the oxygen-containing gas and the hydrogen-containing gas into the process container in a state in which an exhaust of the interior of the process container is stopped; and
   supplying the oxygen-containing gas and the hydrogen-containing gas into the process container in a state in which the interior of the process container is exhausted.

10. The method of claim 8, wherein in (d), a time for maintaining a state in which the exhaust of the interior of the process container is stopped is made longer than a time for maintaining a state in which the interior of the process container is exhausted.

11. The method of claim 1, wherein (d) includes performing opening and closing an exhaust valve installed at an exhaust pipe, which is configured to exhaust the interior of the process container, a predetermined number of times in a state in which the oxygen-containing gas and the hydrogen-containing gas are continuously or intermittently supplied into the process container.

12. The method of claim 1, wherein (d) includes alternately performing, a predetermined number of times:
   supplying the oxygen-containing gas and the hydrogen-containing gas into the process container in a state in which an exhaust valve installed at an exhaust pipe configured to exhaust the interior of the process container is closed; and
   supplying the oxygen-containing gas and the hydrogen-containing gas into the process container in a state in which the exhaust valve is opened.

13. The method of claim 11, wherein in (d), a time for maintaining a state in which the exhaust valve is closed is made longer than a time for maintaining a state in which the exhaust valve is opened.

14. The method of claim 1, wherein in (d), the interior of the process container is pulse-exhausted in a state in which the oxygen-containing gas and the hydrogen-containing gas are continuously or intermittently supplied into the process container.

15. The method of claim 1, wherein in (d), the oxygen-containing gas and the hydrogen-containing gas are supplied into the process container which is in a heated state and at a pressure below an atmospheric pressure.

16. The method of claim 1, wherein in (d), a supply flow rate of the hydrogen-containing gas is made larger than a supply flow rate of the oxygen-containing gas.

17. The method of claim 1, wherein the first nitride film and the second nitride film are films containing at least one selected from the group of a semiconductor element and a metal element, and nitrogen.

18. A method of manufacturing a semiconductor device, comprising:
    (a) loading a substrate into a process container;
    (b) performing a process of forming a first nitride film on the substrate in the process container by alternately or simultaneously performing, a predetermined number of times:
        supplying a precursor gas from a first supplier to the substrate; and
        supplying a nitriding gas from a second supplier to the substrate;
    (c) unloading the processed substrate from an interior of the process container; and
    (d) oxidizing a part of a second nitride film, which is formed inside the process container in (b), into an oxide film so as to have a laminated structure of nitride and oxide in a state in which the processed substrate is unloaded from the interior of the process container,
    wherein in (d), an oxygen-containing gas and a hydrogen-containing gas are supplied into the process container and at that time, the hydrogen-containing gas is supplied toward the first supplier.

19. A substrate processing apparatus, comprising:
    a process container in which a substrate is processed;
    a precursor gas supply system configured to supply a precursor gas from a first supplier to the substrate in the process container;
    a nitriding gas supply system configured to supply a nitriding gas from a second supplier to the substrate in the process container;
    an oxygen-containing gas supply system configured to supply an oxygen-containing gas into the process container;
    a hydrogen-containing gas supply system configured to supply a hydrogen-containing gas into the process container;
    a transporter configured to transport the substrate into and out of the process container; and
    a controller configured to be capable of controlling the precursor gas supply system, the nitriding gas supply system, the oxygen-containing gas supply system, the hydrogen-containing gas supply system, and the transporter so as to perform:
        (a) loading the substrate into the process container;
        (b) performing a process of forming a first nitride film on the substrate in the process container by alternately or simultaneously performing, a predetermined number of times:
            supplying the precursor gas from the first supplier to the substrate; and
            supplying the nitriding gas from the second supplier to the substrate;
        (c) unloading the processed substrate from an interior of the process container; and
        (d) oxidizing a part of a second nitride film, which is formed inside the process container in (b), into an oxide film so as to have a laminated structure of nitride and oxide in a state in which the processed substrate is unloaded from the interior of the process container,
        wherein in (d), the oxygen-containing gas and the hydrogen-containing gas are supplied into the process container and at that time, the hydrogen-containing gas is supplied toward the first supplier.

20. A program that causes, by a computer, a substrate processing apparatus to perform:
    (a) loading a substrate into a process container;
    (b) performing a process of forming a first nitride film on the substrate in the process container by alternately or simultaneously performing, a predetermined number of times:
        supplying a precursor gas from a first supplier to the substrate; and
        supplying a nitriding gas from a second supplier to the substrate;
    (c) unloading the processed substrate from an interior of the process container; and
    (d) oxidizing a part of a second nitride film, which is formed inside the process container in (b), into an oxide film so as to have a laminated structure of nitride and oxide in a state in which the processed substrate is unloaded from the interior of the process container,
    wherein in (d), an oxygen-containing gas and a hydrogen-containing gas are supplied into the process container and at that time, the hydrogen-containing gas is supplied toward the first supplier.

* * * * *